US012625188B2

(12) United States Patent
Zeidler et al.

(10) Patent No.: US 12,625,188 B2
(45) Date of Patent: May 12, 2026

(54) USER DISPLAY FOR REMAINING RUNTIME

(71) Applicant: Briggs & Stratton, LLC, Wauwatosa, WI (US)

(72) Inventors: Nicholas J. Zeidler, Brookfield, WI (US); Steven J. Weber, Germantown, WI (US); Steve Olson, Milwaukee, WI (US)

(73) Assignee: Briggs & Stratton, LLC, Wauwatosa, WI (US)

( * ) Notice: Subject to any disclaimer, the term of this patent is extended or adjusted under 35 U.S.C. 154(b) by 736 days.

(21) Appl. No.: 17/964,551

(22) Filed: Oct. 12, 2022

(65) Prior Publication Data

US 2023/0112436 A1 Apr. 13, 2023

Related U.S. Application Data

(60) Provisional application No. 63/255,167, filed on Oct. 13, 2021.

(51) Int. Cl.
| | |
|---|---|
| *G01R 31/382* | (2019.01) |
| *G01R 31/36* | (2020.01) |
| *H02J 7/00* | (2026.01) |

(52) U.S. Cl.
CPC ....... *G01R 31/382* (2019.01); *G01R 31/3646* (2019.01); *G01R 31/3648* (2013.01); *H02J 7/0048* (2020.01)

(58) Field of Classification Search
None
See application file for complete search history.

(56) References Cited

U.S. PATENT DOCUMENTS

| | | | | |
|---|---|---|---|---|
| 4,673,914 A | * | 6/1987 | Lee ...................... | G07C 9/0069 |
| | | | | 361/172 |
| 7,003,431 B2 | | 2/2006 | Quint et al. | |
| 7,206,704 B2 | | 4/2007 | Quint et al. | |
| 7,317,995 B2 | | 1/2008 | Quint et al. | |
| 7,349,816 B2 | | 3/2008 | Quint et al. | |
| 7,616,002 B2 | | 11/2009 | Quint et al. | |

(Continued)

FOREIGN PATENT DOCUMENTS

KR 101175487 B1 8/2012

OTHER PUBLICATIONS

International Search Report and Written Opinion regarding Application No. PCT/US2022/046430, mail date Feb. 1, 2023, 16 pps.

(Continued)

*Primary Examiner* — Andrew Schechter
(74) *Attorney, Agent, or Firm* — Foley & Lardner LLP

(57) ABSTRACT

A battery-powered outdoor power equipment includes a battery, a first electric motor configured to operate at a first power level and a second power level, a runtime module having a display and a first control button, and a controller in communication with the battery, the electric motor, and the display. The controller being configured to communicate a remaining runtime of the battery to the display based on a charge level of the battery, and update the remaining runtime in response to an input to the first control button that changes the first electric motor from the first power level to the second power level.

13 Claims, 18 Drawing Sheets

(56) References Cited

U.S. PATENT DOCUMENTS

| | | | | |
|---|---|---|---|---|
| 7,915,860 | B2 | 3/2011 | Quint et al. | |
| 10,980,173 | B2 | 4/2021 | Becke et al. | |
| 11,140,814 | B2 | 10/2021 | Spitz et al. | |
| 2004/0199305 | A1* | 10/2004 | Angenendt | B63G 8/08 |
| | | | | 701/21 |
| 2011/0121127 | A1* | 5/2011 | Certain | B64C 27/12 |
| | | | | 701/14 |
| 2014/0116737 | A1* | 5/2014 | Iwata | B25F 5/02 |
| | | | | 173/20 |
| 2015/0000651 | A1 | 1/2015 | Palacharla et al. | |
| 2015/0068322 | A1* | 3/2015 | Kinlen | G01F 1/64 |
| | | | | 73/861.08 |
| 2015/0336650 | A1* | 11/2015 | Fenu | B63H 23/24 |
| | | | | 114/315 |
| 2018/0113498 | A1* | 4/2018 | Cronin | A61B 5/1118 |
| 2018/0115879 | A1* | 4/2018 | Lindqvist | H04W 52/0245 |
| 2018/0162506 | A1* | 6/2018 | Ajello | F02B 61/04 |
| 2019/0388923 | A1* | 12/2019 | Giacalone | B05B 12/00 |
| 2020/0163275 | A1 | 5/2020 | Zhao et al. | |
| 2020/0205338 | A1 | 7/2020 | Zeiler et al. | |
| 2020/0322703 | A1 | 10/2020 | Bures et al. | |
| 2021/0022291 | A1* | 1/2021 | Conrad | A01D 34/685 |
| 2021/0100166 | A1 | 4/2021 | Becke et al. | |
| 2021/0143650 | A1 | 5/2021 | Wang et al. | |
| 2021/0213553 | A1 | 7/2021 | Walker et al. | |
| 2022/0294222 | A1 | 9/2022 | Winter et al. | |

OTHER PUBLICATIONS

Cramer Universal vacuum LS 5000 ESW Operation Manual (2015), website: https://www.remarc.eu/fileadmin/_migrated/content_uploads/LS_5000_ESW_elektro_11-2015_EN.pdf.

Eurogreen Glutton machines catalog, website: http://mg.swdevon.gov.uk/documents/s11107/Appendix.pdf.

Glutton Electric—Urban and Industrial Vaccuum Cleaner catalog, website: https://pdf.directindustry.com/pdf/glutton-cleaning-machines/glutton-electric-urban-industrial-vacuum-cleaner/103047-398567.html.

* cited by examiner

500

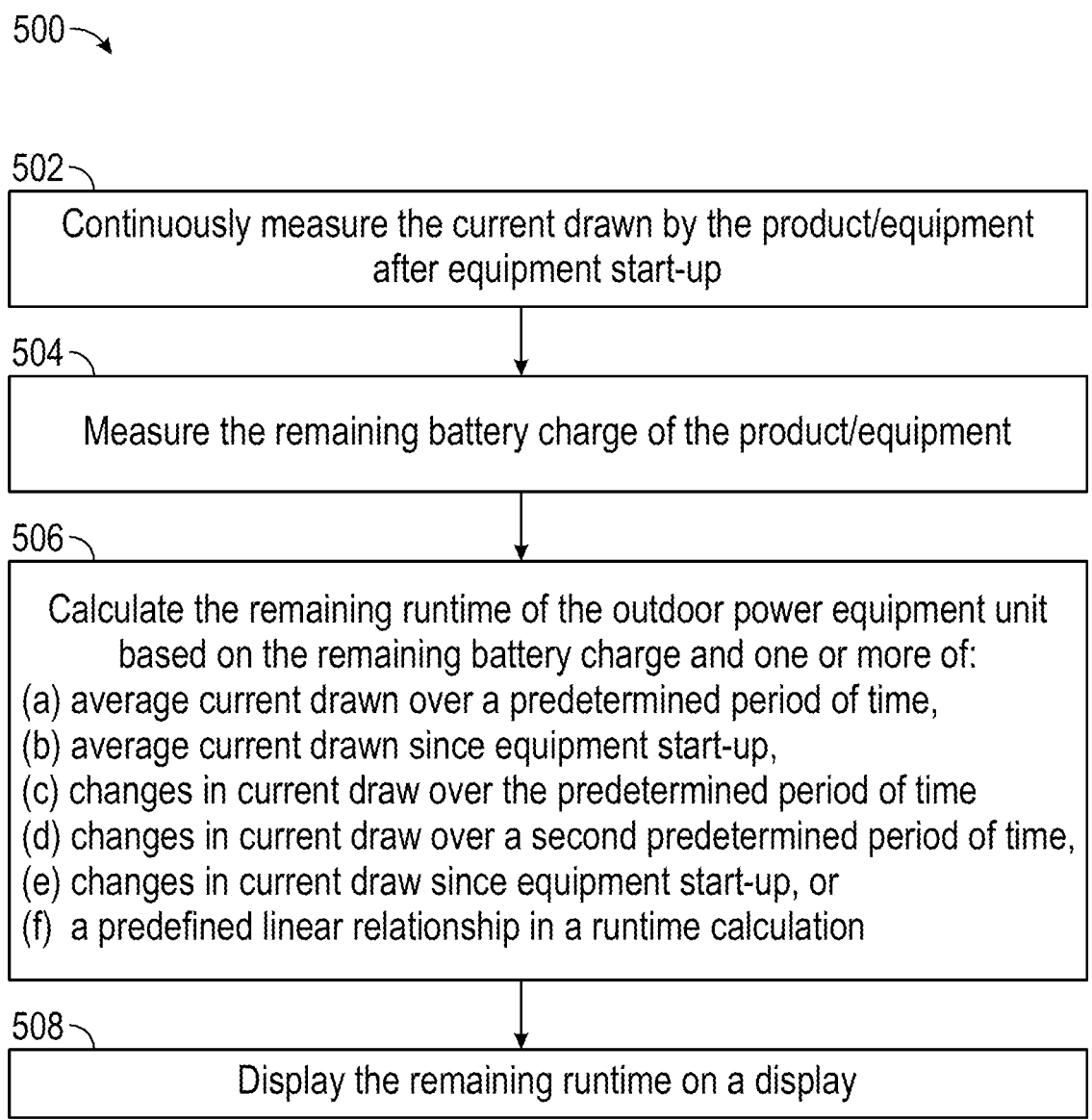

502

Continuously measure the current drawn by the product/equipment after equipment start-up

504

Measure the remaining battery charge of the product/equipment

506

Calculate the remaining runtime of the outdoor power equipment unit based on the remaining battery charge and one or more of:
(a) average current drawn over a predetermined period of time,
(b) average current drawn since equipment start-up,
(c) changes in current draw over the predetermined period of time
(d) changes in current draw over a second predetermined period of time,
(e) changes in current draw since equipment start-up, or
(f) a predefined linear relationship in a runtime calculation

508

Display the remaining runtime on a display

552 — Receive, from a user, an input indicating a desired runtime

554 — Measure the remaining battery charge

556 — Calculate a target current draw based on the desired runtime and the remaining battery charge 558 — Display the remaining runtime on a display and operate equipment/product for remaining runtime

USER DISPLAY FOR REMAINING RUNTIME

CROSS-REFERENCE TO RELATED PATENT APPLICATIONS

This application claims the benefit of and priority to U.S. Provisional Application No. 63/255,167, filed on Oct. 13, 2021, the entire disclosure of which is hereby incorporated by reference herein.

BACKGROUND

Currently, various types of battery-powered equipment or products include a battery gauge that indicates a percentage of remaining battery charge or displays a graphic representing a percentage of remaining battery charge.

SUMMARY

At least one embodiment relates to a battery-powered outdoor power equipment that includes a battery, a first electric motor configured to receive electrical power from the battery and to operate at a first power level and a second power level, a runtime module having a display and a first control button, and a controller in communication with the battery, the first electric motor, and the display. The first control button is configured to change the first electric motor between the first power level and the second power level. The controller having a processor and at least one memory and being configured to: communicate a remaining runtime of the battery to the display based on a charge level of the battery; and update the remaining runtime in response to an input to the first control button that changes the first electric motor from the first power level to the second power level.

Another embodiment relates to a method of communicating to a user a remaining runtime for battery-powered outdoor power equipment. The battery-powered outdoor power equipment including a battery and a first electric motor powered by the battery. The method includes measuring a remaining battery charge of the battery, calculating a remaining runtime of the battery based on the remaining battery charge and one or more of: (a) average current drawn from the battery over a predetermined period of time; (b) average current drawn from the battery since equipment startup; (c) changes in current drawn from the battery over the predetermined period of time; (d) changes in current drawn from the battery over a second predetermined period of time; (e) changes in current drawn from the battery since equipment startup; or (f) a runtime calculation defining a linear relationship between the remaining battery charge and the remaining runtime. The method further includes displaying the remaining runtime on a display.

Another embodiment relates to a method of controlling a power output level of battery-powered outdoor power equipment. The method includes receiving, from a user, an input indicating a desired runtime, calculating, based on the input and a remaining battery charge of the outdoor power equipment, a target current draw of the outdoor power equipment, and operating the outdoor power equipment at an average of the calculated target current draw for the desired runtime. The target current draw is calculated such that the battery charge becomes fully depleted at the end of the desired runtime.

Another embodiment relates to a hand control for battery-powered outdoor power equipment. The hand control includes an electronic display configured to indicate at least one of a remaining battery charge of the outdoor power equipment or a remaining runtime of the outdoor power equipment, a power button configured to switch the outdoor power equipment from an on condition to an off condition, and an power input for adjusting a power output level of the outdoor power equipment. The hand control is configured to be operated with a single hand.

Another embodiment relates to a electronic display unit for a battery-powered pressure washer. The electronic display unit includes a knob for adjusting a power output level of the pressure washer, an electronic display configured to display a remaining runtime of the pressure washer before the battery charge reaches zero, and a power button configured to switch the pressure washer from a standby condition to an off condition.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

BRIEF DESCRIPTION OF THE FIGURES

The disclosure will become more fully understood from the following detailed description, taken in conjunction with the accompanying figures, wherein like reference numerals refer to like elements, in which:

FIG. 18 is a flowchart outlining the steps in a method for communicating to a user a remaining runtime of a battery-powered outdoor power equipment or chore product.

DETAILED DESCRIPTION

Figure 1:
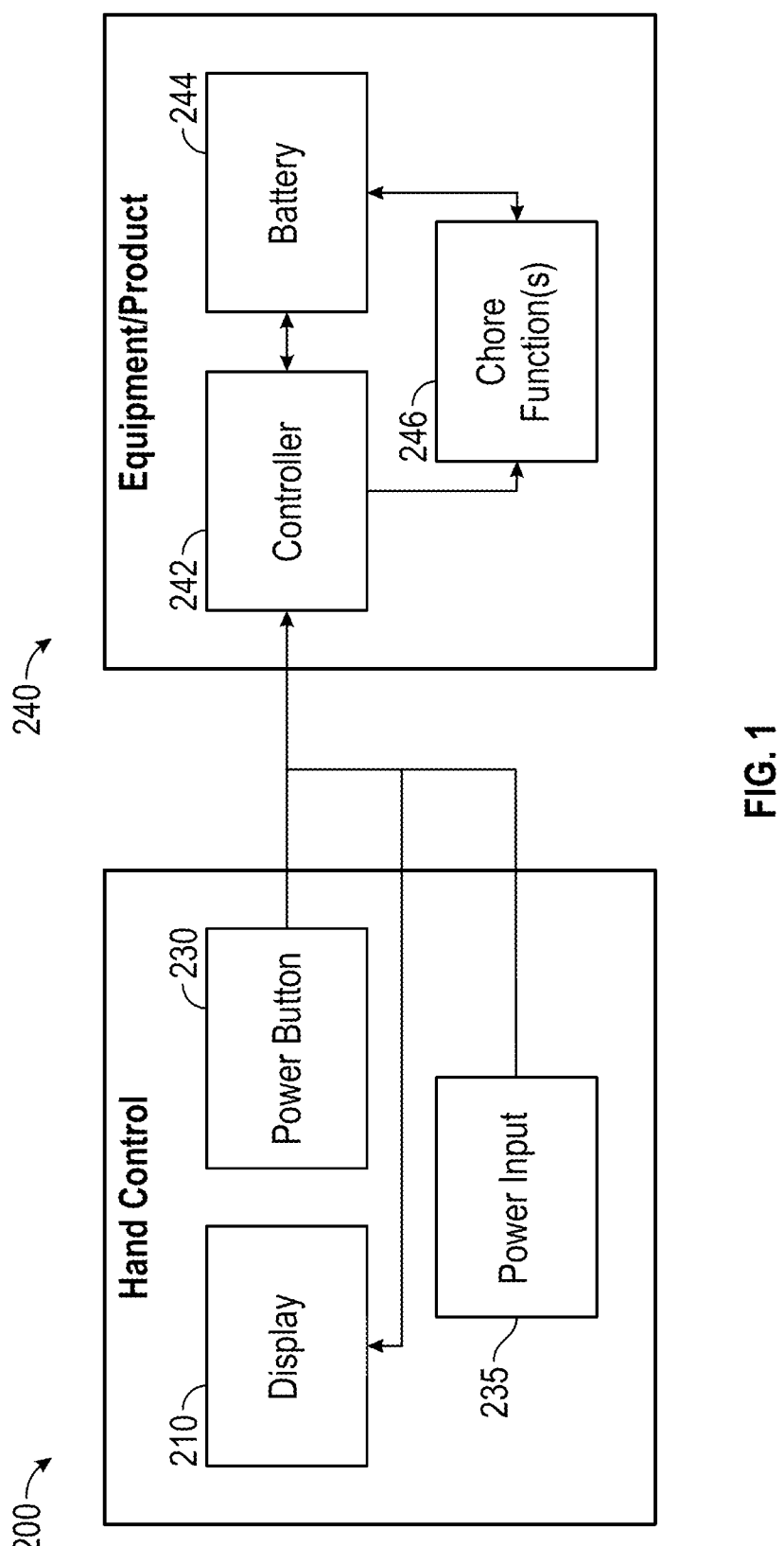
FIG. 1 is a block diagram of a runtime module or hand control and a battery-powered outdoor power equipment or chore product, according to an exemplary embodiment.

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

Referring to the figures generally, the various exemplary embodiments disclosed herein relate to systems, apparatuses, and methods for communicating to a user a remaining runtime of or other information about a battery-powered chore product or outdoor power equipment. It should be understood that the apparatuses for and methods of communicating remaining runtime are not limited to the types of chore products and outdoor power equipment depicted in the figures. The systems and methods described herein can be utilized with other types of chore products or outdoor power equipment including, but not limited to riding tractors, snow throwers, tillers, log splitters, zero-turn radius mowers, stand-on mowers, floor polishers, pavement surface preparation devices, industrial vehicles such as forklifts, utility vehicles, commercial turf equipment such as blowers, vacuums, debris loaders, over-seeders, power rakes, aerators, sod cutters, brush mowers, sprayers, spreaders, etc. The chore product or the outdoor power equipment may include one or more electrically-powered motors, pumps, compressors, and/or actuators.

In some embodiments, a chore product may comprise outdoor power equipment (e.g., a mower, a snow blower, etc.), but a chore product is not limited to being used outdoors (e.g., a floor polisher). In some embodiments, a chore product or electric chore vehicle performs chore. For example, a chore product may include a motor, a pump, an actuator, a compressor, and/or another device that is electrically-powered and performs a chore. In some embodiments, a chore is a task performed, either by a user or autonomously, at or near a household, a farm, an agricultural facility, a building, a sidewalk, a park, a parking lot, a forest, a field, and/or a lawn. In some embodiments, a chore product transports an operator and performs a chore. In some embodiments, a chore product autonomously operates to perform a chore without an operator being present on the product or physically/manually manipulating the product.

In general, conventional chore products and outdoor power equipment make it difficult for a user or operator to estimate to estimate how long (e.g., in minutes or hours) the product or equipment can run for before the battery charge becomes fully depleted. For example, while battery charge level is related to runtime, it does not provide a user with an estimate of how long the product or equipment can run and fails account for changes in load and/or dynamic changes in power output from a battery. As such, the systems and methods described herein provide a runtime module that is configured to display a battery runtime to a user so that the user may operate the product or equipment while being aware of the available runtime.

FIG. 1 illustrates a hand control or runtime module 200 for a battery-powered outdoor power equipment or chore product according an exemplary embodiment. In some embodiments, the hand control 200 may be mounted to an outdoor power equipment unit or chore product in an area accessible to a user of the equipment (see, e.g., FIGS. 9-17). The hand control 200 includes an electronic display 210, a power button 230, and a power input 235. The electronic display 210 may include a graphical user interface and may include a touchscreen configured to detect a touch from a user. The touchscreen may be a capacitive touchscreen or a resistive touchscreen. A resistive touchscreen may be able to detect the touch of a user wearing gloves more accurately than a capacitive touchscreen.

The hand control 200 may be in electrical communication with the various electrical components of an outdoor power equipment or chore product. For example, the hand control 200 may be in electrical communication with a battery or a battery pack, an electric motor or motors, an actuator or actuators, a pump or pumps, a compressor or compressors, and/or a control unit of the outdoor power equipment or chore product. In the illustrated embodiment, the hand control 200 is in communication with an outdoor power equipment or chore product 240. In some embodiments, the chore product 240 includes a controller 242, a battery or battery pack 244, and one or more chore functions 246. The battery 244 is configured to supply electrical power to the controller 242 and the chore function 246. In some embodiments, the chore function 246 is in the form of one or more electric motors, one or more electric actuators, and/or one or more electric actuators. Generally, operation of the chore function 246 performs the intended chore or task of the chore product 240 and/or propels the chore product 240, and this operation drains power from the battery 244. In some embodiments, the battery 244 includes a plurality of battery cells (e.g., multiple lithium-ion battery cells).

The controller 242 is in communication with the chore function 246 and is configured to control the operation thereof. For example, the controller 242 may be configured to control a speed of the chore function 246, a current supplied to the chore function 246 from the battery 244 and/or a voltage supplied to the chore function 246 from the battery 244. In some embodiments, the controller 242 is a master or controller for the chore product 240. In some embodiments, the controller 242 is an individual controller dedicated to the chore function 246 (e.g., a motor controller) that is in communication with a master controller. In the illustrated embodiment, the controller 242 is in communication with the display 210, the power button 230, and the power input 235 of the hand control 200. In some embodiments, the controller 242 is configured to determine a remaining battery power and remaining runtime of the battery 244 and communicate these parameters to the display 210 where they are displayed. As will be described herein, the communication between both the power button 230 and the power input 235 and the controller 242 enables the hand control 200 to control and/or modify an operating mode of the chore product 240 and/or a performance mode of the chore function 246.

Figure 2:
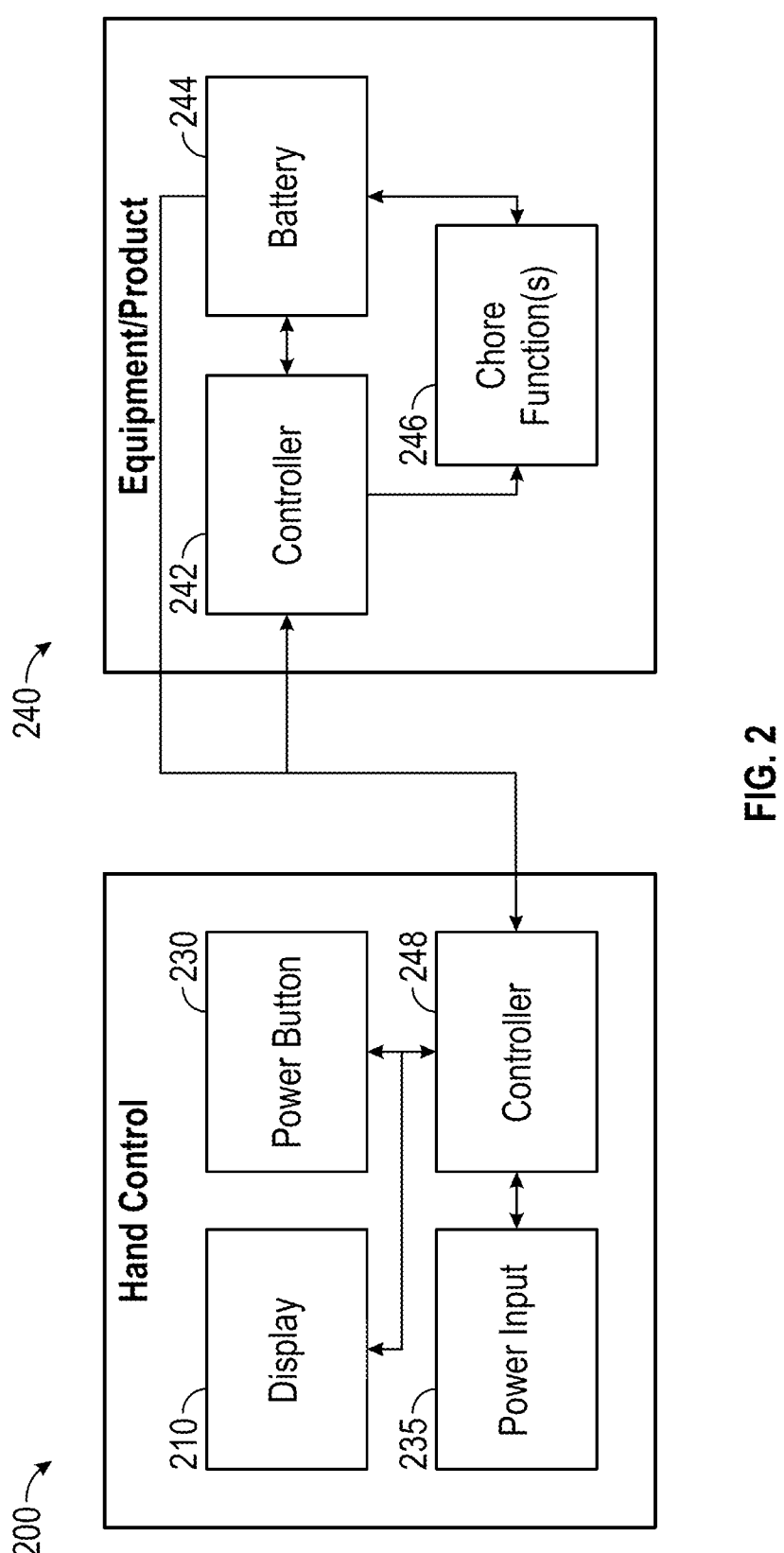
FIG. 2 is a block diagram of the runtime module FIG. 1 including an on-board controller in communication with the outdoor power equipment or chore product.

In some embodiments, rather than receiving the remaining battery power and remaining runtime of the battery 244 from the controller 242 on the chore product 240, the hand control 200 may include a controller 248 arranged, for example, within the body 205. As shown in FIG. 2, in these embodiments, the controller 248 may be in communication with the battery 244 and communicate the remaining battery power and remaining runtime to the display 210. Alternatively, the remaining battery power may be communicated to the controller 248 from the controller 242 and the controller 248 may calculate a remaining runtime. The signals from the power button 230 and the power input 235 may be communicated to the controller 248, which then sends the appropriate signals to the controller 242, or to one or more controllers corresponding to the individual motors/actuators/pumps/compressors that are being controlled by the power button 230 and the power input 235.

Regardless of the particular configuration of the hand control 200, the display 210 is configured to receive (e.g., from the controller 242 or the controller 248) and display a remaining battery power and remaining runtime of the battery 244, and signals from the power button 230 and the power input 235 are communicated (e.g., from the controller 242 or the controller 248) to the chore function 246 to control the operating mode of the chore product 240 and/or a performance mode of the chore function 246. The remaining runtime may be defined as the amount of time that the chore product or outdoor power equipment 240 may run before the battery charge becomes fully depleted and the equipment/product shuts down due to lack of power. The calculation of remaining runtime may be performed by the controller 242, the controller 248 coupled to the display 210, or may be calculated by a control unit (e.g., a battery management system) which may send the remaining runtime to the display 210.

Figure 3:
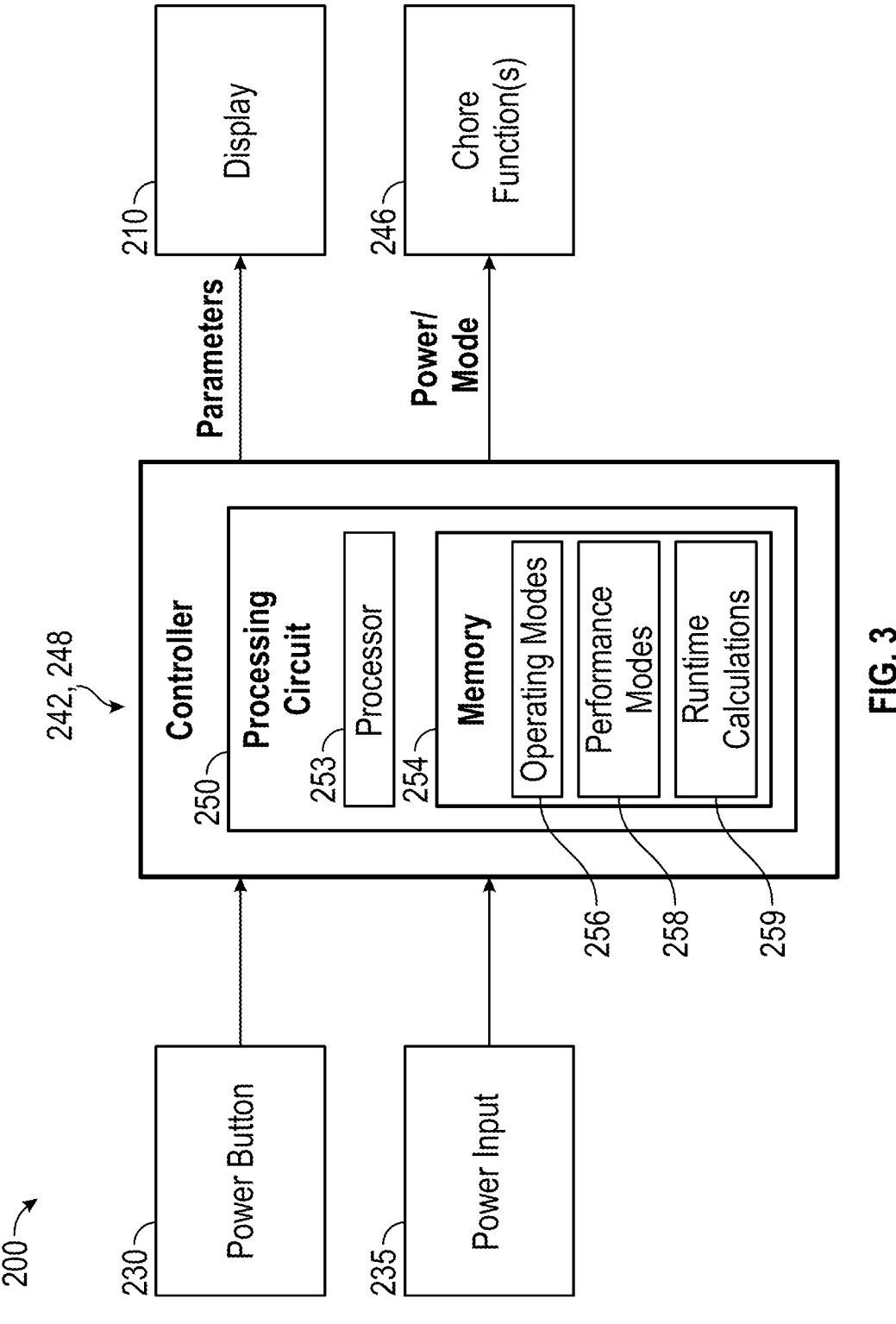
FIG. 3 is a block diagram of a controller of the runtime module or the chore product of FIG. 2.

Turning to FIG. 3, the controller 242 (or the controller 248) includes a processing circuit 250 including a processor 252 and memory 254. The processing circuit 250 can be communicably connected to a communications interface such that the processing circuit 250 and the various components thereof can send and receive data via the communications interface. The processor 252 can be implemented as a general purpose processor, an application specific integrated circuit ("ASIC"), one or more field programmable gate arrays ("FPGAs"), a group of processing components, or other suitable electronic processing components.

The memory 254 (e.g., memory, memory unit, storage device, etc.) can include one or more devices (e.g., RAM, ROM, Flash memory, hard disk storage, etc.) for storing data and/or computer code for completing or facilitating the various processes, layers and modules described in the present application. The memory 254 can be or include volatile memory or non-volatile memory. The memory 254 can include database components, object code components, script components, or any other type of information structure for supporting the various activities and information structures described in the present application. According to some embodiments, the memory 254 is communicably connected to the processor 252 via the processing circuit 250 and includes computer code for executing (e.g., by the processing circuit 250 and/or the processor 252) one or more processes described herein.

As shown in FIG. 3, the memory 254 includes operating modes 256, performance modes 258, and runtime calculations 259. The processing circuit 250 is configured to transition between the different modes and operate the chore product 240 according to an active one of the operating modes 256 and/or an active one of the performance modes 258, and dynamically update the remaining runtime for the battery 244, according to the runtime calculations 259, in response to the active operating mode 256 and/or the active performance mode 258. In some embodiments, the controller 242 may transition between the operating modes 256 in response to a user input to the power button 230.

For example, the power button 230 may be configured to switch the outdoor power equipment or chore product 240 from an off condition to an active mode, and vice versa, when pressed by a user. In some embodiments, the operating modes 256 include the off condition where no power is provided to the chore function 246 and the hand control 200, and the active mode. The outdoor power equipment or chore product 240 may be considered to be in the active mode when the chore function 246 (e.g., one or more electric motors, actuators, compressors, and/or pumps) receive power from the battery or battery pack 244 and the outdoor power equipment or chore product 240 can perform its intended function. For example, a walk-behind mower may be considered to be in active mode when an electric motor spins the blade(s) allowing grass to be cut. A leaf blower may be considered to be in active mode when the motor spins the fan and compressed air exits the blower allowing leaves and debris to be moved.

In some embodiments, the power button 230 may cycle the outdoor power equipment or chore product 240 through various operating modes 256 in addition to the off condition and the active mode. For example, a first press may switch the outdoor power equipment or chore product 240 from the off condition to an accessory mode, a second press may switch the outdoor power equipment or chore product 240 in to the active mode, and a third press may switch the outdoor power equipment or chore product 240 back to the off condition. The accessory mode may enable certain features of the outdoor power equipment or chore product 240 without enabling every feature (e.g., the chore function 246 remain inactive and unpowered). For example, a walk-behind mower in accessory mode may activate (i.e., the controller 242 provides power from the battery 244) the display 210 of the hand control 200 without activating the electric motor that spins the mower blade(s). Alternatively or additionally, the accessory mode may activate a drive motor of the outdoor power equipment or chore product 240 without activating the chore function 246.

In some embodiments, the controller 242 may vary the amount of power provided to the chore function 246 in response to a user input to the power input 235. For example, the power input 235 may be configured to control the power output level of the chore function 246 on the outdoor power equipment or chore product 240. In some embodiments, a user may press down on the power input 235 to increase or decrease the power output level of the chore function 246. The power output level of chore function 246 may refer to different features depending on the type of outdoor power equipment or chore product. For example, an increase in the power output level of a pressure washer may increase the pressure setting of the compressor and increase the velocity of water exiting the sprayer. An increase in the power output level of a snow thrower may increase the speed of the electric motor, allowing snow to be removed faster and thrown farther.

In some embodiments, the controller 242 may be configured to transition between the performance or power usage modes 258 in response to a user input to the power input 235. The performance or power usage modes 258 may include quiet mode, an eco mode, and a responsive mode. In the quiet mode, the chore function 246 may be limited to draw a low amount of power to prioritize battery life over power provided to the chore function 246 (e.g., a blade of a lawn mower, auger of a snow thrower, compressor/pump of a pressure washer, a motor of a floor polisher, etc.) and reduce the sound output of the outdoor power equipment or chore product 240. In the eco mode, the chore function 246 may be limited to an intermediate power setting balancing performance with energy usage. For example, a power limit of the chore function 246 in the quiet mode is less than a power limit in the eco mode. In the responsive mode, a higher or maximum power usage is available to the chore function 246 offering maximum performance.

In some embodiments, the controller 242 is configured to control both a speed of the chore function 246 (e.g., speed of an electric motor) and a current provided to the chore function 246 in the performance modes 258, which limits the power output to the chore function 246 from the battery 244, for example, in the quiet and eco modes. In some embodiments, the quite mode may define a first speed limit on a speed of the chore function 246 and a first current limit on a current provided to the chore function 246. The eco mode may define a second speed limit on a speed of the chore function 246 and a second current limit on a current provided to the chore function 246. The first speed limit is lower than the second speed limit, and the first current limit is lower than the second current limit. The responsive mode may define a third speed limit on a speed of the chore function 246 and a third current limit on a current provided to the chore function 246. The second speed limit is lower than the third speed limit, and the second current limit is lower than the third current limit.

In general, the display 210 is configured to display various information about the outdoor power equipment or chore product 240 and adapt to changes in the operating modes 256, the performance modes 258, and/or the power output to the chore function 246. For example, the display 210 may display an icon or text indicating that the outdoor power equipment or chore product 240 is powered on or powered off. The display 210 may display the operating mode 256 of the outdoor power equipment or chore product 240 (e.g. off condition, accessory mode, or active mode) using text or icons. In some embodiments, the display 210 may indicate that the outdoor power equipment or chore product 240 is in the process of powering up or shutting down. The display 210 may indicate the power output level of the outdoor power equipment or chore product 240. The power output level may be indicated as a percentage of maximum power output or an icon representing a percentage of maximum power output.

In some embodiments, the display 210 may indicate the performance mode 258 (e.g. quiet mode, eco mode, or responsive mode) using text or icons. The display 210 may indicate the remaining battery charge. The remaining battery charge may be indicated as a percentage of the total battery capacity or as an icon representing the percentage of the remaining battery charge. For example, the display 210 may show an icon that appears to be a two-dimensional representation of an outline cylindrical battery, a percentage of which is filled in corresponding to the percentage of battery charge remaining. The display 210 may indicate the remaining runtime of the outdoor power equipment or chore product 240 based on the remaining battery charge (e.g., state of charge), the usage patterns, the operating modes 256, and/or the performance modes 258 of the outdoor power equipment or chore product 240.

Figure 4:
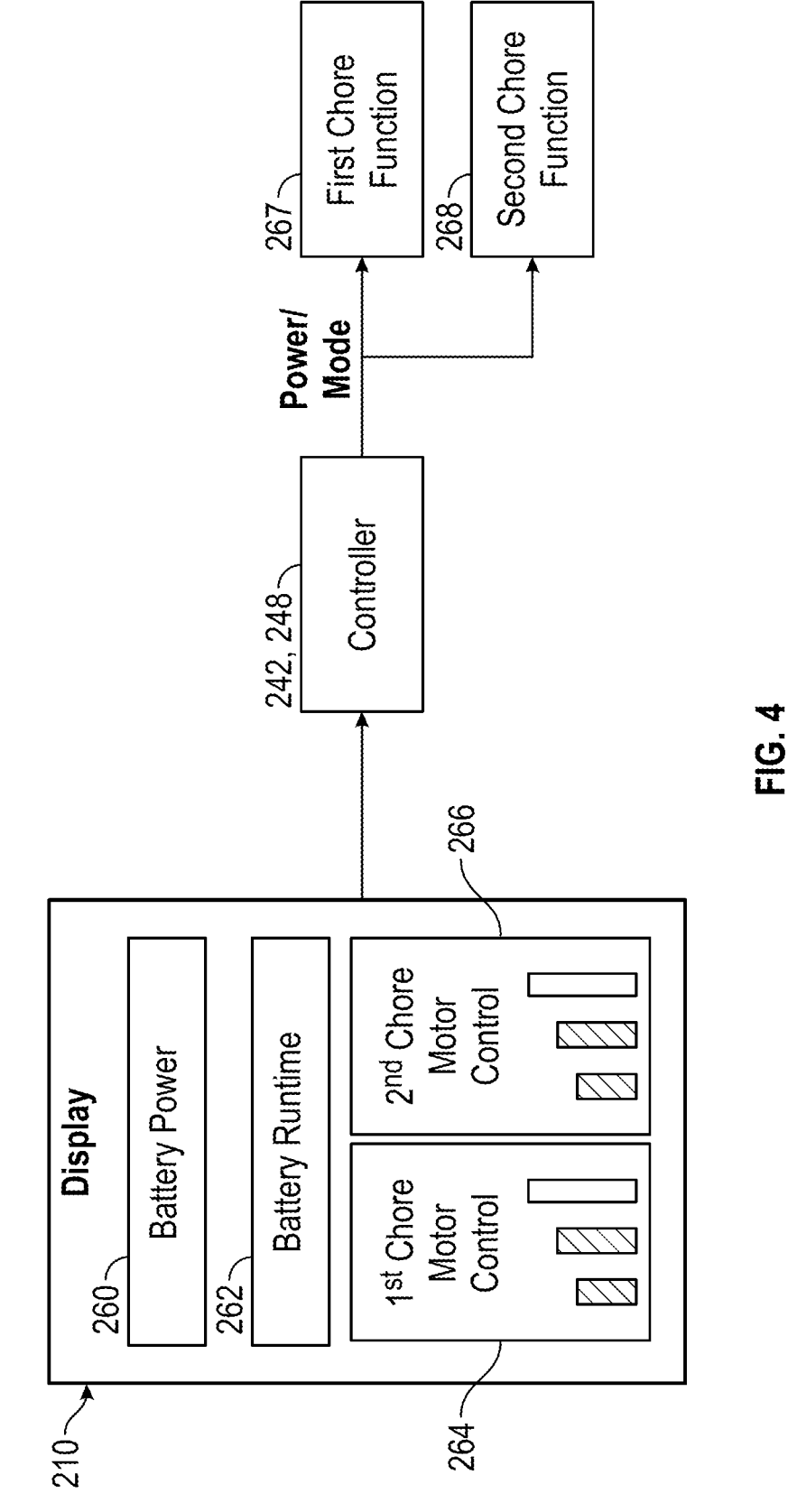
FIG. 4 is a block diagram of a display of the runtime module of FIG. 1 or FIG. 2.

In some embodiments, the display 210 may include graphical buttons that may be touched by a user to control a power output, or performance mode, of one or more chore functions 246. For example, the power input 235 may be incorporated into a graphical button on the display 210 rather than being a physical switch or lever. In some embodiments, as shown in FIG. 4, the display 210 may include a battery power module 260, a battery runtime module 262, a first chore motor control button 264, and a second chore motor control button 266. The battery power module 260 is a graphical display that can include one or more icons, texts, or numbers to display a remaining battery percentage to a user. For example, the battery power module 260 may include a pictorial representation of a battery that is filled in according to the remaining battery charge and a numerical indication of the remaining battery percentage overlaid on the pictorial representation of the battery. The battery runtime module 262 includes a numerical display (e.g., days:hours:minutes, days:hours:minutes:seconds, hours:minutes, hours:minutes:seconds, etc.) of the remaining battery runtime. As will be described herein, the remaining runtime displayed in the battery runtime module 262 on the display 210 provides an operator or user with a visual indication of how long the battery 244 can provide power to the chore product 240 (e.g., power to the chore function 246) and maintain operation of the chore product 240. The battery runtime module 262 is configured to dynamically update the remaining runtime displayed based on the remaining battery charge and the selected performance mode of one or more chore functions (i.e., a user's input to the first chore motor control button 264 and/or the second chore motor control button 266).

In some embodiments, the one or more chore functions 246 include a first chore function 267 and a second chore function 268 that are controller by the display. Specifically, the first chore motor control button 264 is a graphical button that may be touched by a user to change a performance mode of a first chore function 267 (e.g., increase or decrease a power level available to the first chore function 267). Similarly, the second chore motor control button 266 is a graphical button that may be touched by a user to change a performance mode of a second chore function 268 (e.g., increase or decrease a power level available to the second chore function). In some embodiments, the first chore motor control button 264 includes symbols to indicate the current performance mode or power level of the first chore function 267. For example, the first chore motor control button 264 may include a plurality of bars (as shown in FIG. 4), a dial, or another indicator that indicates the performance mode or power level. In some embodiments, the bars on the first chore motor control button 264 may fill in according to the active power level (e.g., one bar for a low power level, two bars for an intermediate power level, and three bars for a high power level). Similarly, the second chore motor control button 266 includes symbols to indicate the current performance mode or power level of the second chore function 268. For example, the second chore motor control button 266 may include a plurality of bars (as shown in FIG. 4), a dial, or another indicator for the performance mode or power level. In some embodiments, the bars on the second chore motor control button 266 may fill in according to the active power level (e.g., one bar for a low power level, two bars for an intermediate power level, and three bars for a high power level). In some embodiments, the first chore motor control button 264 and the second chore motor control button 266 may include a symbol indicative of the function that they control (e.g., a wheel for control of a traction motor, a blade for control of a mower blade, etc.).

In general, the display 210 is configured to dynamically update the battery runtime module 262 with the remaining runtime of a battery (e.g., the battery 244) in response to a user touching, either individually or separately, the first chore motor control button 264 and the second chore motor control button 266. For example, the controller 242 (or the controller 248) may be configured to calculate the remaining runtime based on the runtime calculation 259 for various combinations of performance modes or power levels for the first chore function 267 and the second chore function 268. In some embodiments, the runtime calculation 259 includes a plurality of linear relationships to calculate runtime based on a battery state of charge, with each linear relationship being unique to a particular performance mode or power level of a chore function.

Figure 5:
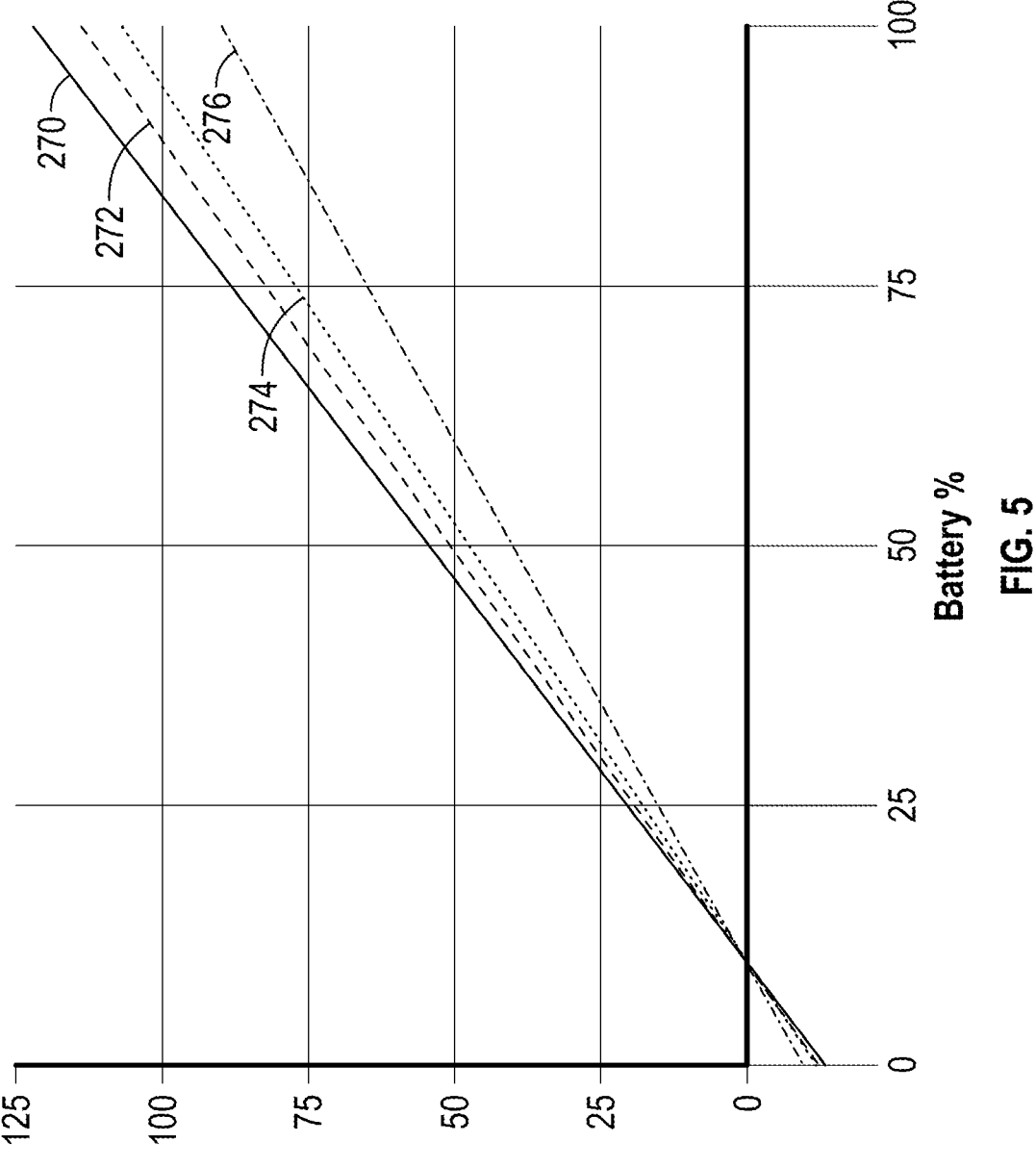
FIG. 5 is a graph illustrating a plurality of linear relationships used in a runtime calculation of the runtime module of FIG. 1 or FIG. 2.
Figure 6:
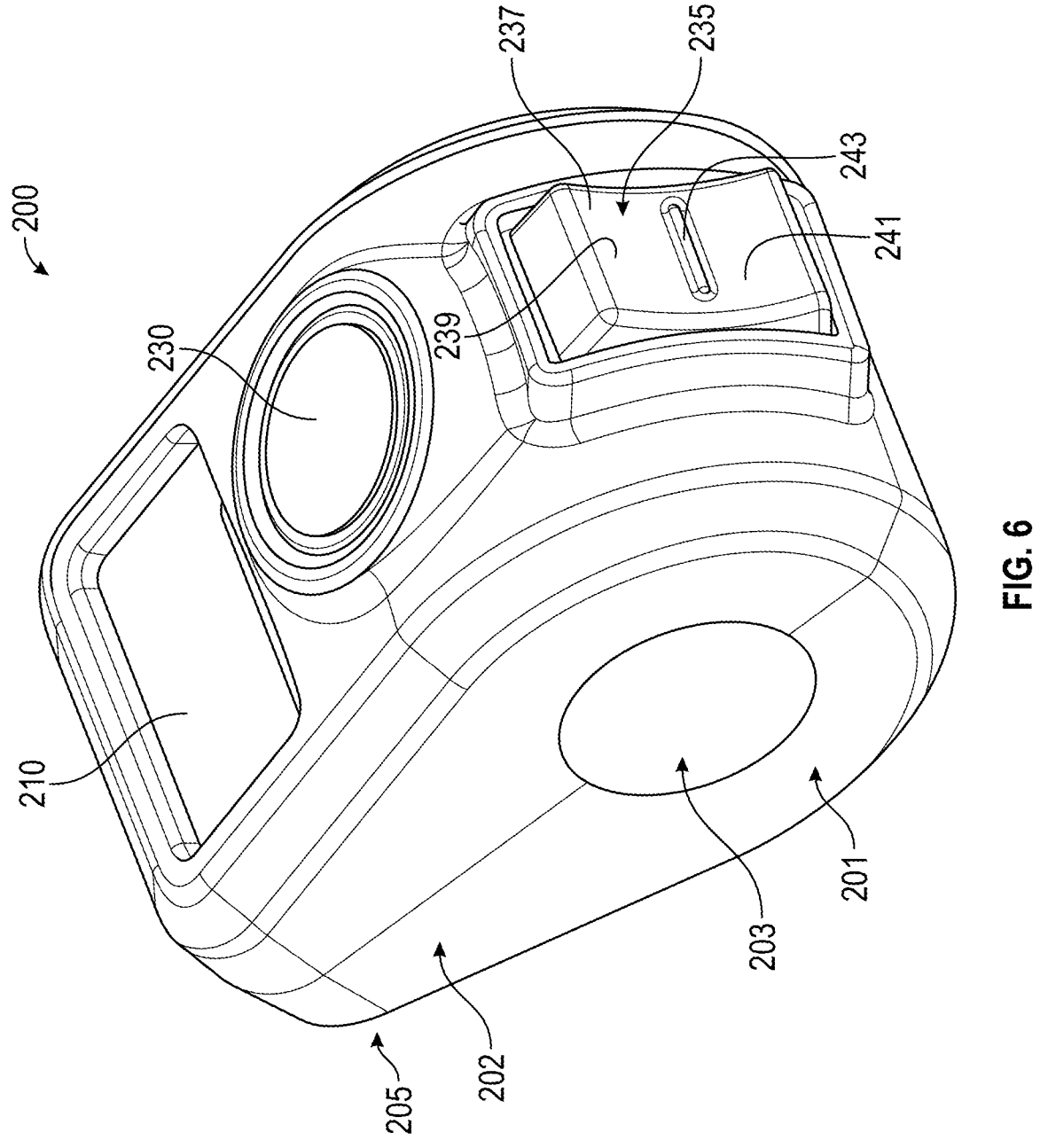
FIG. 6 is a perspective view of the hand control or runtime module of FIG. 1 or FIG. 2, according to an exemplary embodiment.

FIG. 5 shows a graph illustrating an exemplary embodiment of a linear relationship between a remaining runtime and a battery power level (e.g., state of charge). Accordingly, the runtime calculation 259 may store a linear equation that outputs a remaining runtime based on the battery power level input. For example, the battery power level may be communicated from the battery 244 to the controller 242 (or the controller 248) and the runtime calculation 259 calculates the remaining runtime, which is then displayed on the display 210. In the illustrated embodiment, the graph of FIG. 6 includes a first linear relationship 270, a second linear relationship 272, a third linear relationship 274, and a fourth linear relationship 276, each of which defines a different slope and y-intercept value. In some embodiments, each of the first linear relationship 270, the second linear relationship 272, the third linear relationship 274, and the fourth linear relationship 276 corresponds to a power level or performance mode of a chore function (e.g., the chore function 246, the first chore function 267, the second chore function 268). For example, the first linear relationship 270 corresponds to a first power level of a chore function, the second linear relationship 272 corresponds to a second power level of a chore function that is higher than the first power level, the third linear relationship 274 corresponds to a third power level of a chore function that is higher than the second power level, and the fourth linear relationship 276 corresponds to a fourth power level of a chore function that is higher than the third power level. In some embodiments, the chore function (e.g., the chore function 246, the first chore function 267, or the second chore function 268) may be switched between the first power level, the second power level, the third power level, and the fourth power level in response to a user input (e.g., to the power input 235, to the first chore motor control button 264, or to the second chore motor control button 266). As illustrated in FIG. 5, the slope defined by the linear relationships 270, 272, 274, 276 decreases as the active power level increases in allowed power output by the chore function, which corresponds to less remaining runtime.

The display 210 is configured to dynamically update the battery runtime module 262 based on the selection of the first, second, third, or fourth power level. For example, the chore function may be operating at the first power level and the battery runtime module 262 may display the remaining runtime based on the first linear relationship 270 in the runtime calculation 259. Once a user provides an input (e.g., to the power input 235, to the first chore motor control button 264, or to the second chore motor control button 266) to change the power level of the chore function from the first power level to the second power level, the runtime calculation 259 switches from the first linear relationship 270 to the second linear relationship 272 and the battery runtime module 262 updates to include a new value for the remaining runtime (e.g., a lower value based on the increased power level) on the display 210. This dynamic updating of remaining runtime occurs each time a user changes the power level of the chore function, and the remaining runtime continuously updates based on the active power level and the battery power level.

In some embodiments, the runtime calculation 259 and the linear relationships 270, 272, 274, and 276 are defined for various combined power levels of the first chore function 267 and the second chore function 268. In some embodiments, the first chore function 267 (e.g., a drive or traction motor) is configured to operate in a lower power mode, an intermediate power mode, and a high power mode, and the second chore function 268 (e.g., a cutting motor coupled to a cutting blade, an actuator, or a compressor) is a configured to operate in a lower power mode, an intermediate power mode, and a high power mode. The switching between the lower, intermediate, and high power modes for the first chore function 267 and the second chore function 268 is controlled by the first chore motor control button 264 and the second chore motor control button 266, respectively. For example, at startup, the first chore function 267 may be in the low power mode, and a user may press the first chore motor control button 264 once to change to the intermediate power level. A subsequent press of the first chore motor control button 264 may change to the high power level, and another subsequent press may change back to the low power level. Similar functionality may be applied to the second chore function 268 and the second chore motor control button 266. Accordingly, a user may sequentially cycle through the low, intermediate, and high power modes by pressing the first chore motor control button 264 and the second chore motor control button 266.

The runtime calculation 259 is defined to calculate the remaining runtime for all combinations of active power modes of the first chore function 267 and the second chore function 268. For example, the runtime calculation 259 includes linear relationships for the outer bounds of possible combinations of power levels, and the remaining combinations are interpolated based on the linear relationships for the outer bounds. In some embodiments, the first linear relationship 270 corresponds to both the first chore function 267 and the second chore function 268 being in the low power mode (i.e., low/low), the second linear relationship 272 corresponds to the first chore function 267 being in the low power mode and the second chore function 268 being in the high power mode (i.e., low/high), the third linear relationship 274 corresponds to the first chore function 267 being in the high power mode and the second chore function 268 being in the low power mode (i.e., high/low), and the fourth linear relationship 276 corresponds to both the first chore function 267 and the second chore function 268 being in the high power mode (i.e., high/high).

With the outer bounds of the power mode combinations (i.e., all combinations of high and low power modes) being defined by the linear relationships 270, 272, 274, and 276 in the runtime calculation 259, the runtime calculation 259 is configured to interpolate (e.g., linear interpolation between the linear relationships 270, 272, 274, 276) to calculate the remaining runtime for the other power mode combinations within the outer bounds (i.e., high/intermediate, low/intermediate, intermediate/high, intermediate/low, intermediate/intermediate). As such, the runtime calculation 259 is configured to continuously calculate the remaining runtime and dynamically update the battery runtime module 262 on the display 210, in response to a user input that changes the power mode for the first chore function 267 and/or the second chore function 268, for all possible combinations of power levels of the first chore function 267 and the second chore function 268.

In an exemplary embodiment, the first chore function 267 is a drive motor on a battery-powered lawn mower (see, e.g., FIGS. 9 and 13), and the second chore function 268 is a cutting motor coupled to a cutting blade on the battery-powered lawn mower. Changing the first chore function 267 between the low, intermediate, and high power modes controls a travel speed limit of the battery-powered lawn mower (e.g., low travel speed, intermediate travel speed, high travel speed). Changing the second chore function 268 between the low, intermediate, and high power modes controls a cutting speed of the cutting blade (e.g., low cutting speed, intermediate cutting speed, and high cutting speed). In this embodiment, for example, the first linear relationship 270 may define a slope of about 1.36 and a y-intercept of about −13.6, the second linear relationship 272 may define a slope of about 1.26 and a y-intercept of about −12.6, the third linear relationship 274 may define a slope of about 1.18 and a y-intercept of about −11.8, and the fourth linear relationship 276 may define a slope of about 0.994 and a y-intercept of about 9.94.

In some embodiments, the runtime calculation 259 may alternatively or additionally calculate the remaining runtime based on the remaining battery charge (e.g., state of charge) and the average power usage over a predetermined period of time. For example, the controller 242 or the controller 248 may read that the battery pack 244 of the chore product or outdoor power equipment 240 has 2.0 amp-hours of charge remaining and that the equipment/product 240 has drawn an average of 0.5 A during the previous 15 minutes of use. The runtime calculation 259 may then calculate the remaining run time as 2.0 amp-hours divided by 0.5 A, or 4 hours. The display 210 may then indicate the remaining runtime to the user.

The runtime calculation 259 may also take into account changes in the usage patterns of the chore product 240 during the same period of time. For example, the controller 242 or the controller 248 may read that the battery pack 244 has 2.0 amp-hours of charge remaining, that the equipment has drawn an average of 0.5 A during the previous 15 minutes of use, and that during that 15 minutes, the amount of current drawn has increased from 0.4 A to 0.6 A. The runtime calculation 259 may determine that the current drawn will continue to increase or otherwise remain at level higher than 0.5 A and may calculate a shorter runtime than the 4 hours that would be calculated if only the average current draw were used. The calculated runtime may then be displayed by the display 210.

The runtime calculation 259 may also take into account changes in the usage patterns of the chore product 240 during a second period of time. For example, the controller 242 or the controller 248 may read that the battery pack 244 has 2.0 amp-hours of charge remaining, that the equipment has drawn an average of 0.5 A during the previous 15 minutes of use, and that during the previous hour of use, the amount of current drawn has decreased from 0.8 A to 0.4 A. The runtime calculation 259 may determine that the current drawn will continue to decrease or otherwise remain at a level lower than 0.5 A and may calculate a longer runtime than the 4.0 hours that would be calculated if only the average current draw were used. The calculated runtime may then be displayed by the electronic display.

The runtime calculation 259 may alternatively or additionally take into account the average battery usage since startup. Equipment startup may be the time that the chore product 240 is switched from the off condition to the accessory mode, or may be the time that the outdoor chore product 240 is moved from the accessory mode to the active mode. For example, the controller 242 or the controller 248 may read that the battery pack 244 has 2.0 amp-hours of charge remaining and that the equipment has drawn an average of 1.0 A since equipment startup. The runtime calculation may then calculate the remaining run time as 2.0 amp-hours divided by 1.0 A, or 2 hours. The display 210 may then indicate the remaining runtime to the user.

The runtime calculation 259 may also take into account changes in the usage patterns of the chore product 240 since startup. For example, the controller 242 or the controller 248 may read that the battery pack 244 unit has 2.0 amp-hours of charge remaining, that the equipment has drawn an average of 1.0 A during the previous 15 minutes of use, and that during that 15 minutes, the amount of current drawn has increased from 0.8 A to 1.2 A. The runtime calculation 259 may determine that the current drawn will continue to increase or otherwise remain at a level higher than 1.0 A and may calculate a shorter runtime than the 2 hours that would be calculated if only the average current draw since equipment startup were used. The calculated runtime may then be displayed by the display 210.

In another exemplary embodiment, a user may input a desired runtime into the outdoor power equipment or chore product 240 (e.g., at the display 210), and the controller 242 or the controller 248 may calculate a target current draw that will allow the unit to run for the input runtime. A user may input a desired runtime using a keypad or buttons the display 210. The controller 242 or the controller 248 may read the remaining battery charge and calculate a target current draw for that allows for the desired runtime. The target current draw may be calculated such that the battery or battery pack 244 will become fully depleted at the end of the desired runtime. For example, the controller 242 or the controller 248 may read that a battery pack 244 has 2.0 amp-hours of charge remaining. A user may input a desired runtime of 2.0 hours, indicating that the user desires to use the equipment for 2.0 hours. The controller 242 or the controller 248 may then calculate a target current draw that will allow the chore product 240 to operate for 2.0 hours. The controller 242 or the controller 248 may divide 2.0 amp-hours by 2.0 hours to calculate a target current draw of 1.0 A. The controller 242 or the controller 248 may then instruct the chore function(s) (e.g., the chore function 246, the first chore function 267, and/or the second chore function 268) to operate at an average of the target current draw. The chore function(s) may draw current steadily at the target current draw or may draw varying amounts of current at an average of the target current draw. The battery 244 may become fully depleted at the end of the desired runtime.

Figure 7:
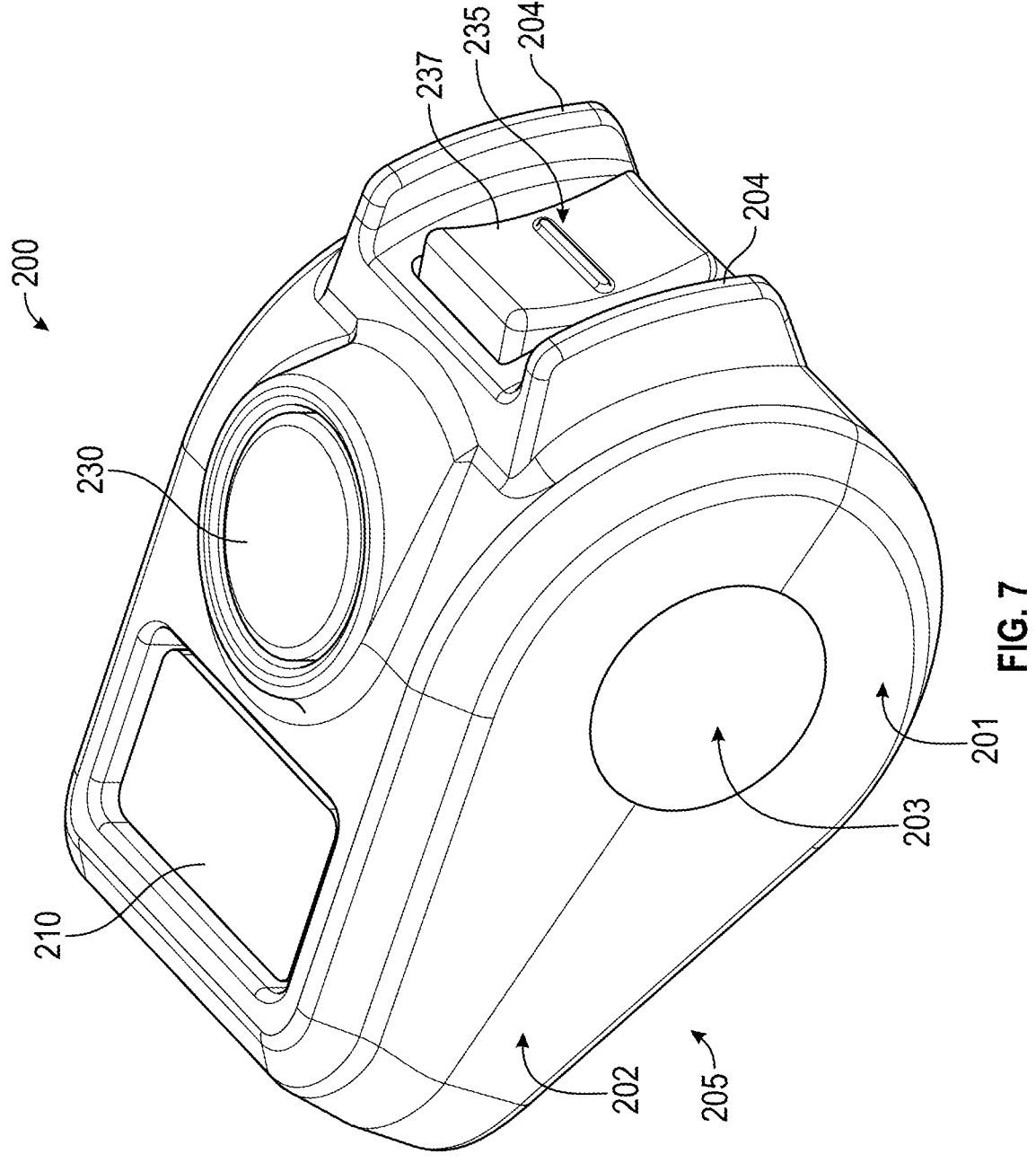
FIG. 7 is a perspective view of the hand control of FIG. 6 including a side walls.

In general, the design and shape of the hand control or runtime module 200 may be adapted to various types of outdoor power equipment and chore products. In some embodiments, the power input 235 may be designed to accommodate a position of a user's hand as the chore product or outdoor power equipment is operated. For example, FIG. 7 illustrates the hand control 200 including a body 205 having an outer profile may be roughly teardrop shaped (e.g., when viewed from the side). The body 205 includes a circular or round portion 201 on one end and a second portion 202 that is roughly in the shape of an isosceles trapezoid at an opposing end of the body 205. For example, the legs of the trapezoid being roughly tangential to the roughly circular portion 201 and the smaller base of the trapezoid being farthest from the roughly circular portion 201. In other words, the body 205 tapers as it extends from the first portion 201 to the second portion 202.

The outer profile of the body 205 may be extruded in a direction roughly normal to the profile and edges of the body 205 may be chamfered or filleted. In some embodiments, the body 205 of the hand control 200 may include an opening, aperture, or channel 203 extending laterally through the body 205. The opening 203 may be configured to receive a portion of a handle, rod, or another part of an outdoor power equipment or chore product such that the hand control 200 may be mounted to the handle or other feature. The profile of the opening 203 may be similar the shape of the feature to which the body 205 is configured to mount. In the illustrated embodiment, the opening 203 defines a round or circular shape to form a cylindrical channel so as to receive a cylindrical feature such as a portion of a cylindrical pipe-shaped handle. The opening 203 may be arranged approximately at a center of the circular portion 201 of the body 205 (e.g., the opening 203 may be concentric with a circle defined by the circular portion 201).

In the illustrated embodiment, the power button 230 is in the form of a push-button switch and is mounted on the body 205. In some embodiments, the power button 230 may be a dial or a selector rather than a push-button. In some embodiments, the power button 230 may be recessed into the body 205 to prevent the power button 230 from being pressed unintentionally. In the illustrated embodiment, the power input 235 is in the form of a rocker switch 237 having a first side 239 and a second side 241. The rocker switch 237 rotates or pivots about a midpoint 243, and springs mounted within the body 205 return or bias the rocker switch 237 to a neutral position after the rocker switch 237 has been pressed down by a user. In some embodiments, a user may press down on the first side 239 of the power input 235 to increase the power output level of the chore function 246 and may press down on the second side 241 of the power input 235 to decrease the power output level of the chore function 246.

In the illustrated embodiment, the display 210 is mounted within the body 205 on an upper surface thereof (e.g., a same surface as the power button 230), which enables a user to both access the power button 230 and simultaneously visualize the display 210.

FIG. 7 illustrates the hand control 200 having the rocker switch 237 with raised portions or walls 204 that extend from the body 205 on each of at least two sides of the rocker switch 237 (e.g., lateral sides of the rocker switch 237). The raised portions 204 may extend a distance from the body 205 that is greater than a distance that the rocker switch 237 extends from the body 205. In general, the raised portions 204 may prevent the rocker switch 237 from being pressed unintentionally.

Figure 8:
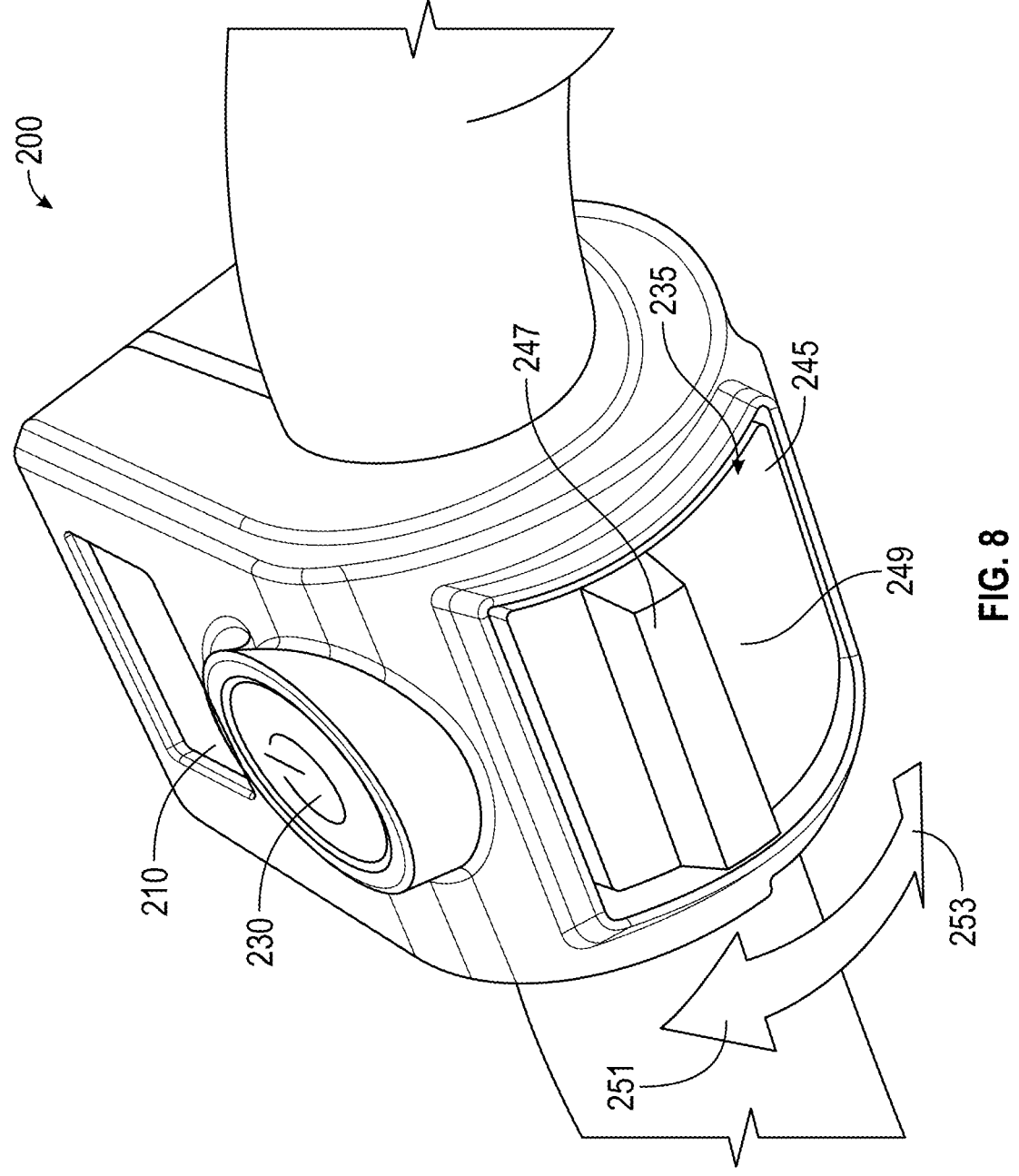
FIG. 8 is a perspective view of the hand control of FIG. 6 including a rotary power input.

Turning to FIG. 8, the hand control 200 includes a power input 235 in the form of a slider switch 245. The slider switch 245 includes a thumb knob 247 and a cover 249. The cover 249 protects the inner components of the hand control 200 from water and other contaminants when the slider switch 245 is moved. The slider switch 245 may variably adjust the power output level or mode of a chore function on the outdoor power equipment or chore product. Moving the thumb knob 247 of the slider switch 245 in a first direction 251 may increase the power output level or mode of the chore function, while moving the thumb control 247 of the slider switch 245 in a second direction 253 may decrease the power output level chore function. The slider switch 245 may have discrete positions corresponding to specific power output levels or may adjust the power output level proportionately based on the position of the thumb control 247 between a maximum position (e.g., displaced all the way in the first direction 251) and a minimum position (e.g., displaced all the way in the second direction 253). In some embodiments, the slider switch 245 may move along a roughly circular path with an axis of rotation that passes through one or both of the center line of the opening 203 or the center of the circular portion 201 of the body 205.

Figure 9:
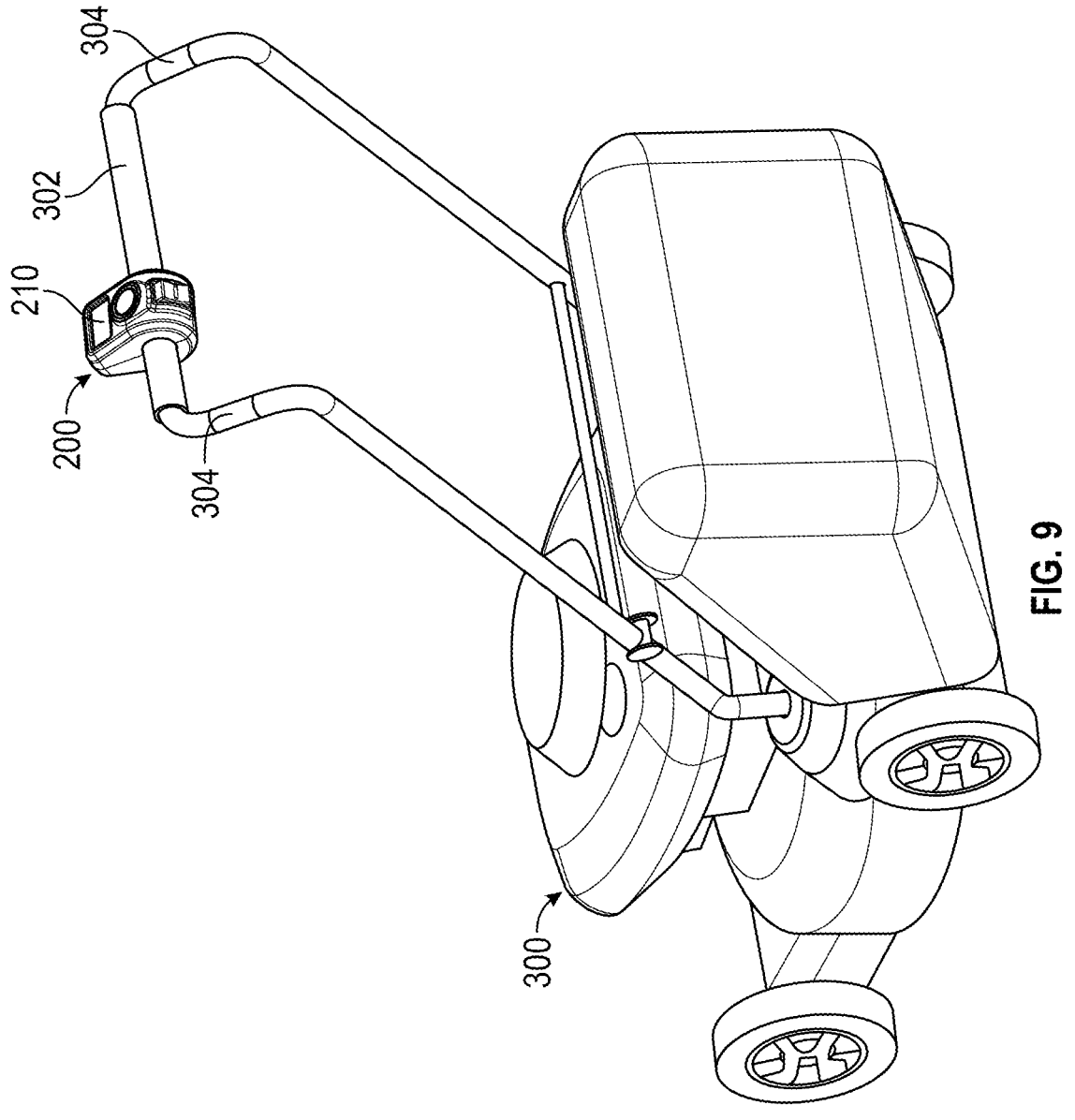
FIG. 9 is a perspective view of a walk-behind mower with the hand control of FIG. 6.

In general, the hand control or runtime module 200 may be incorporated into or installed on various types of chore products and outdoor power equipment. FIG. 9 the chore product or outdoor power equipment 240, in the form of a battery-powered walk-behind mower 300, with the hand control 200 mounted to its handle 302. While the hand control 200 is shown mounted to the handle 302 of the walk-behind mower 300, the hand control 200 may be mounted to a handle of various types of chore products or outdoor power equipment. The hand control 200 may also be mounted to various parts of outdoor power equipment that are accessible to a user of the equipment. For example, the hand control 200 may be mounted to one of the push bars 304 of the walk-behind mower 300.

Figure 10:
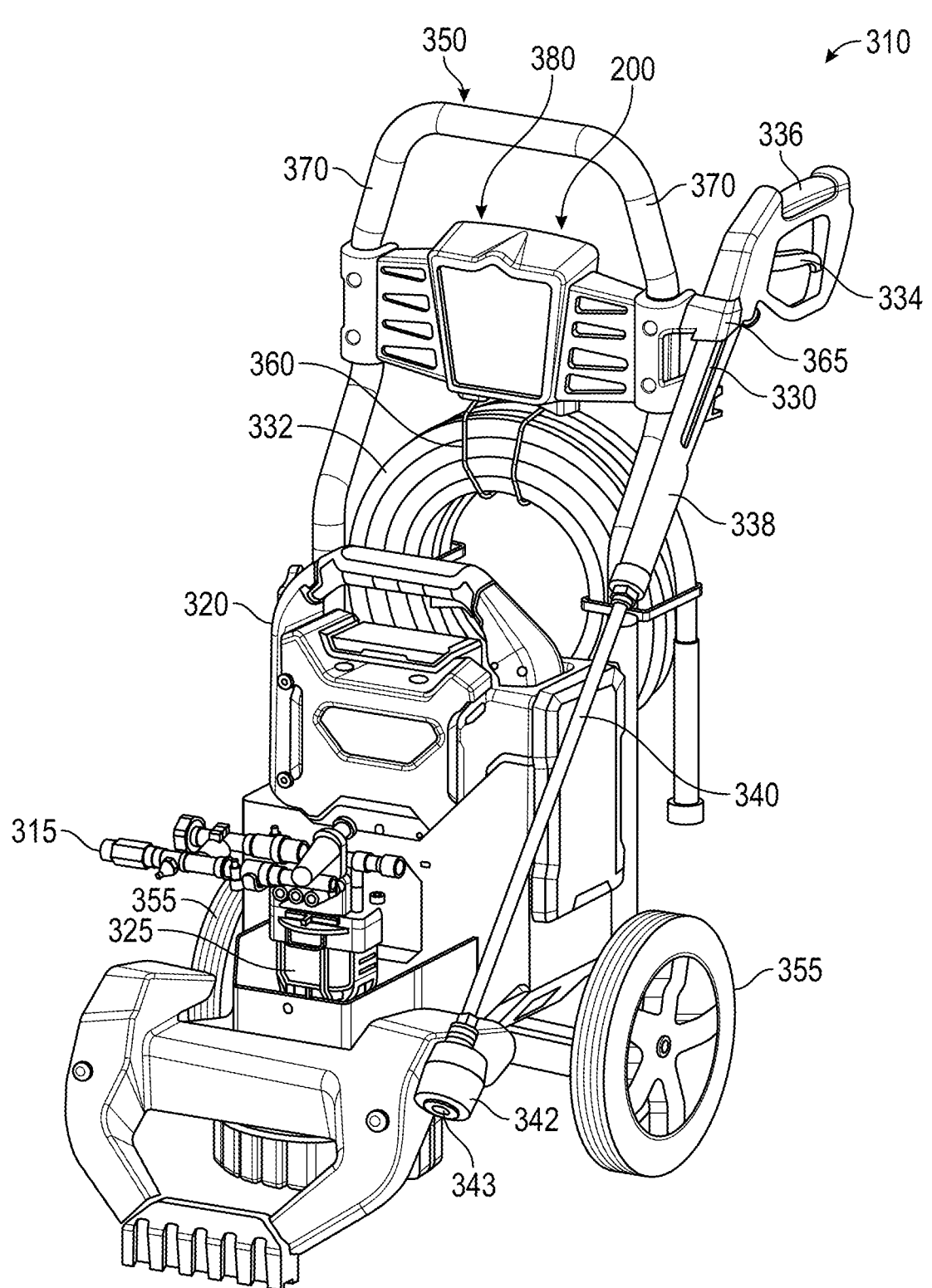
FIG. 10 is a perspective view of a pressure washer with an electronic display unit having the runtime module of FIG. 1 or FIG. 2.

FIG. 10 illustrates the chore product or outdoor power equipment 240 in the form of a battery-powered pressure washer 310. The pressure washer 310 may include an inlet 315, a battery pack 320 (e.g., the battery 244), a compressor 325, a sprayer 330, a sprayer hose 332 and a handle 350. The compressor 325 may include one or more electric motors. The sprayer 330 may include a trigger 334, a handle grip 336, a forward handle 338, an extension pipe 340, and a nozzle 342. In some embodiments, the pressure washer 310 may include wheels 355, a hook 360 for storing the inlet hose, and a sprayer receiver 365 for storing the sprayer 330. The handle 350 may be coupled to one or more vertical members 370, which may be coupled to the other elements of the pressure washer 310. The pressure washer 310 may be configured to receive a water hose at the inlet 315. Water may enter the pressure washer 310 through the inlet and be directed into the compressor 325. The compressor 325 may pressurize the water, which may travel through the sprayer hose 332 into the sprayer 330. Water may travel through the extension pipe 340 and exit the nozzle 342 at a high velocity through an aperture 343 when the trigger 334 is depressed. The nozzle aperture 343 may have a smaller cross sectional area than a cross section of the inside of the extension pipe 340 to increase the velocity of the water as it exits the sprayer 330.

The pressure washer 310 includes the runtime module 200 within an electronic display unit 380. The electronic display unit 380 may be coupled to the one or more vertical members 370. The electronic display unit 380 may be arranged in an area accessible to a user of the pressure washer 310. In some embodiments, the sprayer receiver 365 may be integrated into the electronic display unit 380.

Figure 11:
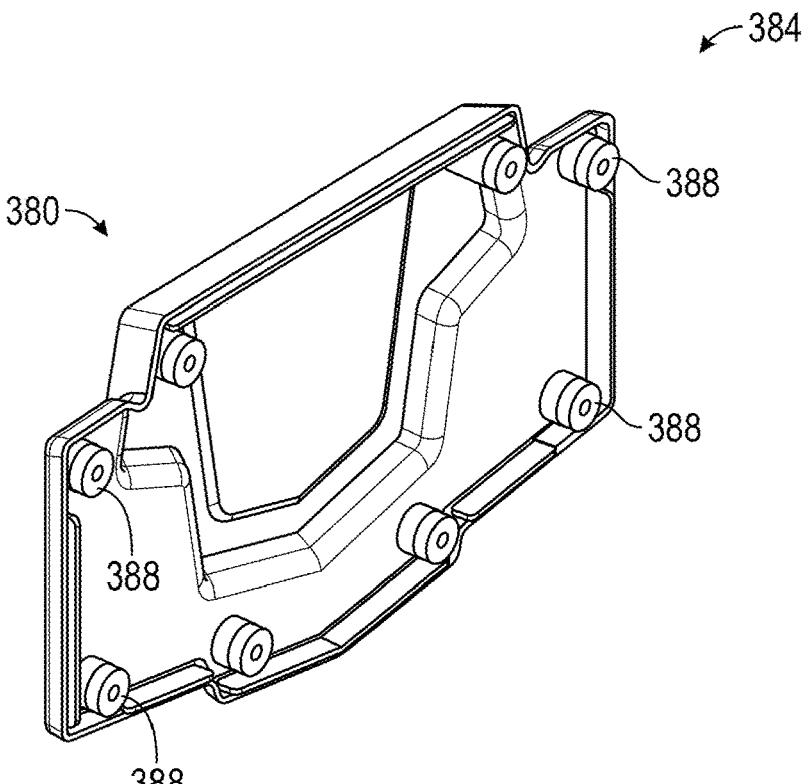
FIG. 11 is a perspective view of a rear panel of the electronic display unit of FIG. 10.
Figure 12:
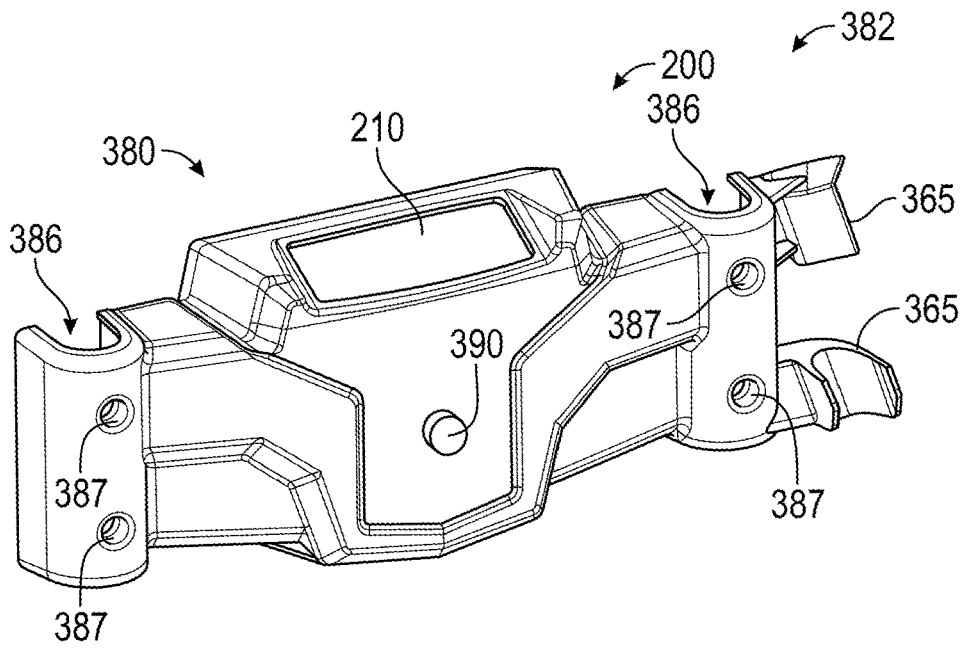
FIG. 12 is a perspective view of a front panel of the electronic display unit of FIG. 10.

With reference to FIGS. 11 and 12, the electronic display unit 380 includes a front panel 382 and a rear panel 384. The front panel 382 includes one or more vertical openings 386 for receiving the vertical members 370 therein, and a plurality of bolt holes 387. The bolt holes 387 may receive bolts or other fasteners for mounting the electronic display unit 380 to the vertical members 370. The bolt holes 387 may be counterbored such that the bolts do not extend past an outer surface of the front panel 382. The bolts or other fasteners may extend through the bolt holes 387 of the front panel 382 and through holes in the vertical members 370, and be coupled to the rear panel 384. The rear panel 384 may include holes 388 configured to receive the bolts or other fasteners. In some embodiments, the holes 388 may be threaded. The holes 388 may be through-holes, and the bolts may be configured to be received by nuts on a back side of the rear panel 384. The holes 388 may be counterbored on the back side of the rear panel 384 such that the nuts or the ends of the bolts do not extend past the outer surface of the rear panel 384.

In some embodiments, the front panel 382 may include a knob 390 configured to adjust the pressure level of the pressure washer 310. The pressure level may increase when the knob 390 is turned in a first direction and may decrease when the knob is turned in a second direction. In some embodiments, the knob 390 represents the power input 235 of the runtime module 200 and the display 210 is configured to dynamically update the remaining runtime in response to a user changing the pressure level by turning the knob 390.

In the illustrated embodiment, the front panel 382 includes the display 210. As described herein, the display 210 may include a graphical user interface and may include a touchscreen configured to detect a touch from a user. The display 210 may be angled upward to improve visibility to a user standing behind the pressure washer 310. The electronic display unit 380 and the display 210 may be in electrical communication with the battery pack 320 of the pressure washer 310 or may be in electrical communication with a control unit coupled to battery pack 320. The battery pack 320 may include multiple battery cells (e.g., multiple lithium-ion battery cells). The electronic display unit 380 and the display 210 may be configured to determine the remaining battery charge in the battery or battery pack 320 according to the systems and methods described herein (e.g., via the runtime calculation 259 or another method described herein).

In some embodiments, the display 210 displays various information about the pressure washer 310. For example, the display 210 may display an icon or text indicating that the pressure washer 310 is powered on or powered off. The display 210 may indicate the power condition of the pressure washer 310 (e.g., off condition, accessory mode, or active mode). The display 210 may indicate that the pressure washer 310 is in the process of powering up or shutting down. The display 210 may indicate the power output level of the pressure washer 310. The power output level may be indicated as a percentage of maximum power output or an icon representing a percentage of maximum power output. The display 210 may indicate the power output mode (e.g. quiet mode, eco mode, responsive mode, low power mode, intermediate power mode, high power modes, etc.) using text or icons. The display 210 may indicate the remaining battery charge and the remaining runtime. The calculated remaining runtime of the pressure washer 310 may indicate the remaining time that the trigger 334 can be depressed and water can be sprayed, or a "trigger-on" condition, before the battery 320 charge becomes fully depleted. Additionally or alternatively, the calculated remaining runtime may indicate the total amount of time remaining including both the remaining trigger-on time and the combined remaining time in the trigger-on condition and standby condition before the battery charge becomes fully depleted. The "standby condition" may refer to when the compressor is running and pressurizing the water while the trigger is not depressed and water is not being sprayed.

Figure 13:
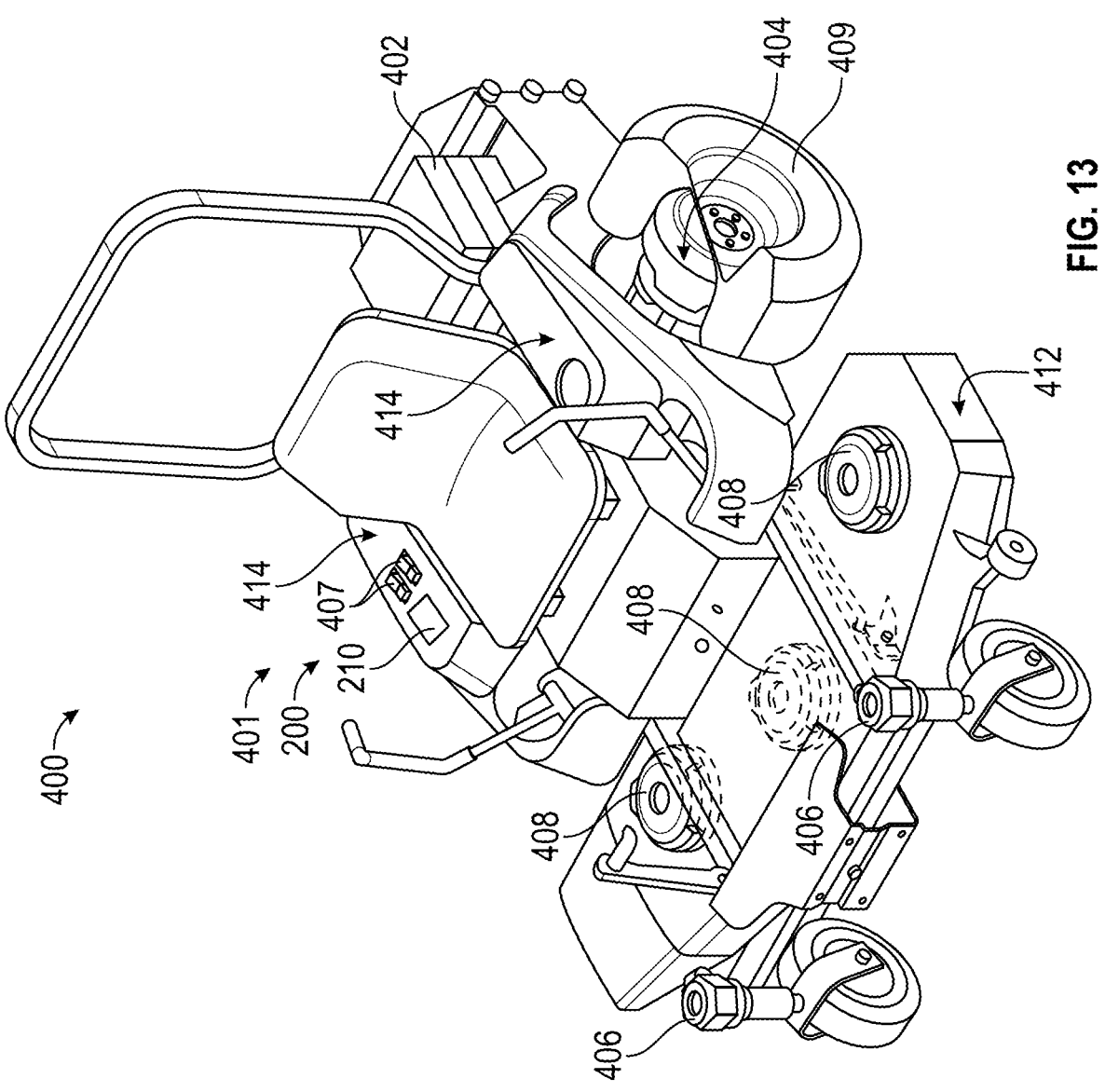
FIG. 13 is a perspective view of a riding lawn mower in the form of a zero turn radius mower including the runtime module of FIG. 1 or FIG. 2.
Figure 14:
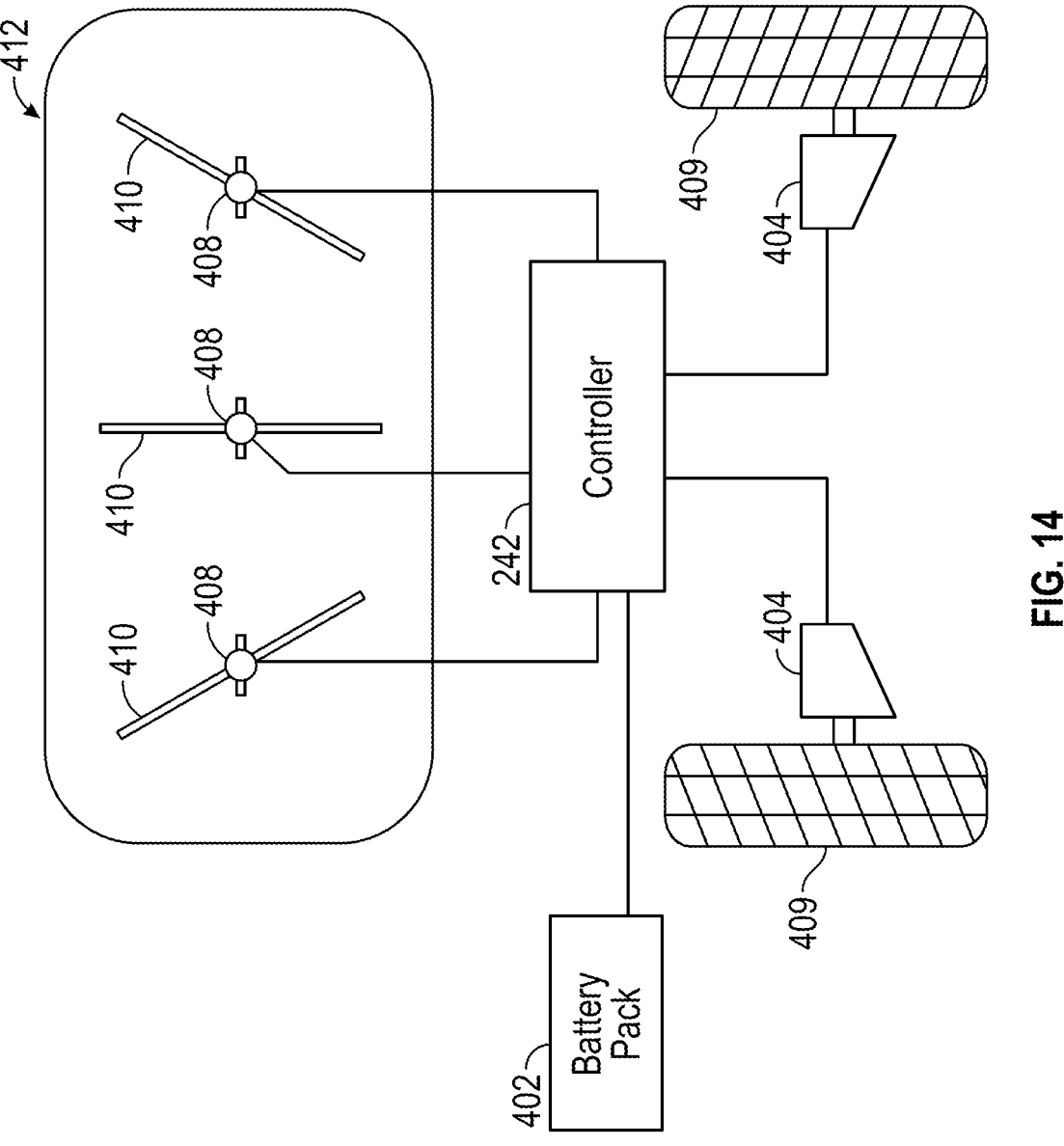
FIG. 14 is a schematic illustration of the mower of FIG. 14 illustrating cutting blades coupled to cutting motors.

FIGS. 13 and 14 illustrate the chore product or outdoor power equipment 240 in the form of a battery-powered riding lawn mower (e.g., a zero-turn-radius (ZTR) mower) 400. The hand control or runtime module 200 may installed onto the mower 400 to control a power mode of one or more electric motors on the mower 400 and/or to display a remaining runtime of a battery pack used to power the electric motors on the mower 400. In some embodiments, the runtime module 200 is integrated into a control panel 401 that is installed on the mower 400.

The mower 400 includes a battery or battery pack 402 (e.g., the battery 244) and a number of electric motors. In some embodiments, the motors are brushless DC motors. In other embodiments, the motors are one or a combination of brushed DC motors, AC motors, permanent magnet motors, etc. The mower 400 may have one or more traction motors 404, one or more hub motors 406, and/or one or more implement motors 408. In some embodiments, the mower 400 may have a traction motor 404 for each of the rear drive wheels 409, with each traction motor 404 being powered by the battery 402. In some embodiments, the mower 400 may have a hub motor 406 for each non-traction wheel (e.g., hub or castor wheels). The hub motors 406 may allow for the non-traction wheels to be positioned or locked into position when operating the mower 400 in certain modes.

In some embodiments, the mower 400 may have one or more implement or cutting motors 408, each being powered by the battery 402. The implement motors 408 may be used to drive one or more attachments associated with the mower 400. In some embodiments, the implement motors 408 may each drive a cutting implement, such as a rotary cutting device (e.g., blade, rotating blade, spinning blade, etc.), shown as mower blade 410 (see, e.g., FIG. 14). However, in other examples, the implement motors 408 may be used to drive other attachments such as spreaders, blowers, power rakes, or other applicable attachments.

In some embodiments, the implement motors 408 are located on or within a mowing deck 412. The mowing deck 412 may house the implement motors 408 and one or more cutting blades 410 attached to each of the implement motors 408. In some embodiments, the implement motors 408 may be connected via a central bus. The central bus may provide power and communications to and from other devices, such as the controller 242 and/or the battery pack 402. In some embodiments, the central bus may allow for a single connection from the mowing deck 412 to a body of the mower 400. The computing power used for the mower 400 may be distributed across a plurality of controllers and controller modules. In addition, different controllers or controller modules receive and transmit data with each other to make decisions and perform actions such that decentralized information processing takes place across the controllers.

In some embodiments, the mower 400 may include other features such as an adjustable seat 414 and armrests 416 arranged on laterally-opposing sides of the seat 414. In some embodiments, the adjustable seat 414 may be coupled to the battery pack 402 and configured to be adjusted via one or more electronic positioning devices. In still further embodiments, the adjustable seat 414 may include one or more heating or cooling elements, powered by the battery pack 402, to provide for operator comfort.

In some embodiments, the battery pack 402 is a rechargeable battery (e.g., rechargeable battery, rechargeable battery bank, rechargeable battery array, rechargeable energy storage device, etc.). In some embodiments, the battery pack 402 may be a rechargeable battery, such as a Li-ion battery. However, other battery types, such as NiCd, lead-acid, Nickel-Metal Hydride (NiMH), or Lithium Polymer, are also contemplated. The battery pack 402 may be a lithium-ion battery comprising multiple Li-ion cells arranged in a variety of series (S) and parallel (P) configurations. In some embodiments, the battery pack 402 provides about one kilowatt-hour of energy (e.g., between 800 watt-hours and 1.2 kilowatt-hours). In some embodiments, the battery pack 402 is configured to be small enough, light enough, and graspable enough to allow the battery pack 402 to be manually portable by the user. In other embodiments, the battery pack 402 is not configured to be small enough, light enough, and graspable enough to allow the battery pack 402 to be manually portable by the user. For example, a user may need a lift, hoist, or other carrying device to move the battery pack 402. In some embodiments, end products powered by the battery pack 402 generally scale in increments that can be measured in kilowatt-hours of energy. For example, a standard residential lawn tractor may require between two and three kilowatt-hours of energy capacity and a premium residential lawn tractor may require between three and four kilowatt-hours of energy capacity. The battery pack 402 may be interchangeable between different pieces of equipment or chore products (e.g., between a lawn tractor, a backup power supply, a stand-alone power supply, a pressure washer, etc.). In some embodiments, the battery pack 402 is configured to be removed without the use of tools. For example, the battery pack 402 may be removably coupled to the mower 400 by one or more latches, straps, detents, magnets, electrical coupler, etc., or any combination thereof.

Figure 15:
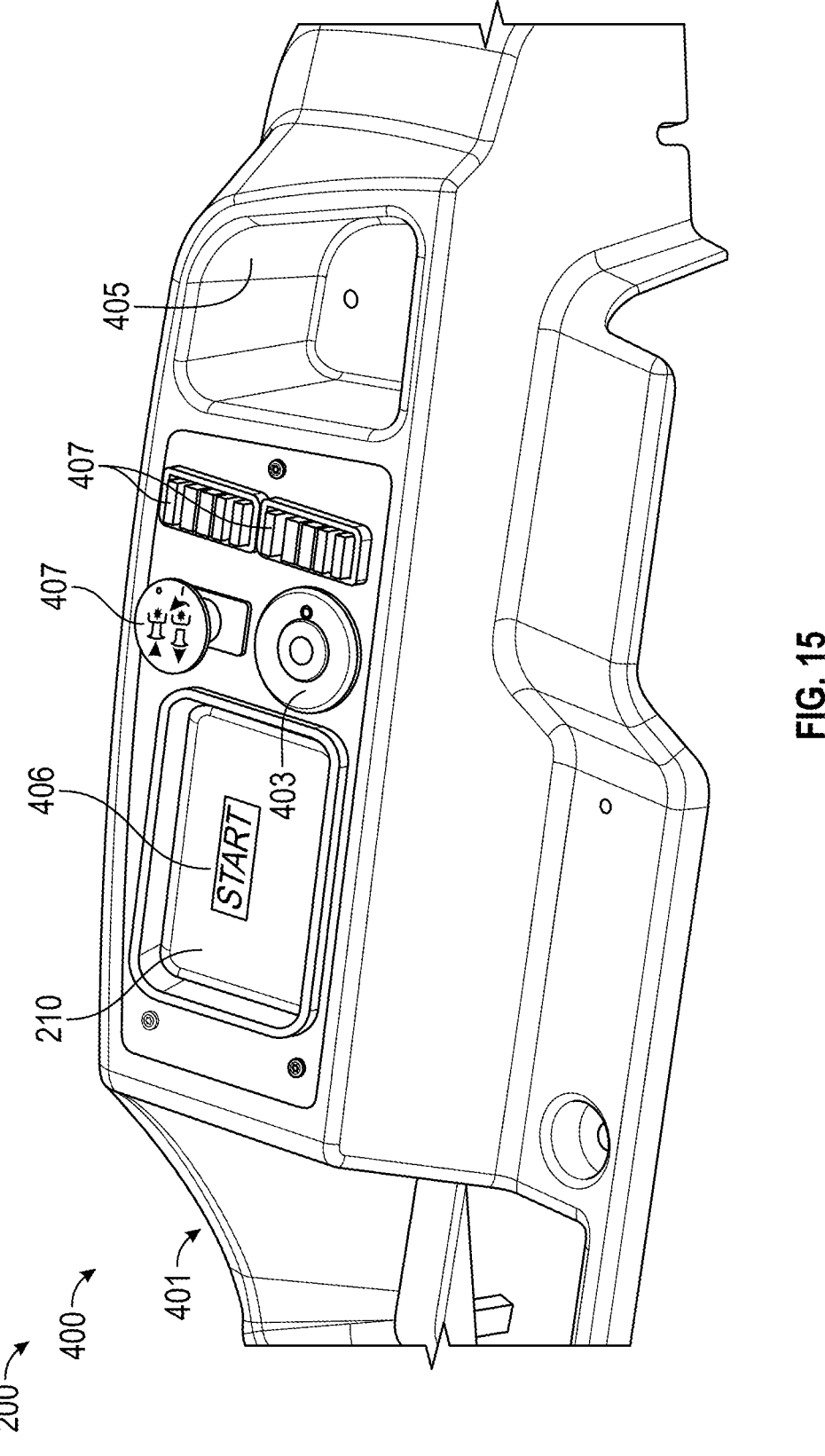
FIG. 15 is a perspective view of a control panel of the mower of FIG. 13 including the runtime module of FIG. 1 or FIG. 2.

In general, the control panel 401 and the runtime module 200 are arranged on an outer surface of the mower 400 so that a user may view and interface with the runtime module 200. In the illustrated embodiment, the control panel 401 is arranged on a side of the seat 414 (i.e., on one of the armrests 416). The display 210 of the runtime module 200 may indicate the remaining runtime of mower 400 based on the remaining battery charge and the runtime calculations 259 described herein. Turning to FIG. 15, the control panel 401 may include a power button 403 configured to switch the mower 400 from an off condition to accessory mode and from accessory mode or active mode to an off condition. The control panel 401 may have additional controls 407 that may be in the form of physical buttons, knobs, and/or switches, or may be additional electronic displays including touchscreens configured to detect a touch from a user. The additional controls may, for example, receive an input from the user to adjust the speed or height of the mower blades. Alternatively, the display 210 may include the first chore motor control button 264 to control a speed of the traction motors 404 and the second chore motor control button 266 to control a speed of the implement motors 408 (and thereby a speed of the blades 410). The control panel 401 may include a compartment 405 for storing objects such as keys or cell phones. The compartment 405 may include a USB outlet for charging phones and other devices.

In the illustrated embodiment, the display 210 includes a graphical start button 418 configured to be pressed by the user to move the mower 400 from an accessory mode to an active mode. In some embodiments, the display 210 may be configured to receive a signal from one or more safety sensors (e.g., via the controller 242 or the controller 248). The one or more safety sensors may be configured to detect whether various features of the mower 400 are in a ready-to-start condition. For example, the mower 400 may include a seat sensor configured to detect whether a user is seated in the seat 414. The seat sensor may signal a ready-to-start condition when it detects a user in the seat 414. The mower 400 may also include a brake sensor configured to detect whether a brake is engaged. The brake sensor may signal a ready-to-start condition when it detects that the brake has been disengaged. The graphical start button 418 may not appear on the display 210 until either the controller 242 or the controller 248 receives a signal from each of the safety sensors indicating that the respective features are in a ready-to-start condition. The mower 400 may not switch into active mode until each feature is in a ready-to-start condition, the graphical start button 418 appears on the display 210, and the user presses the graphical start button 418 using the touch screen of the display 210. The display 210 may indicate, by displaying text or a plurality of graphical icons indicating whether each feature is in a ready-to-start condition.

Figure 16:
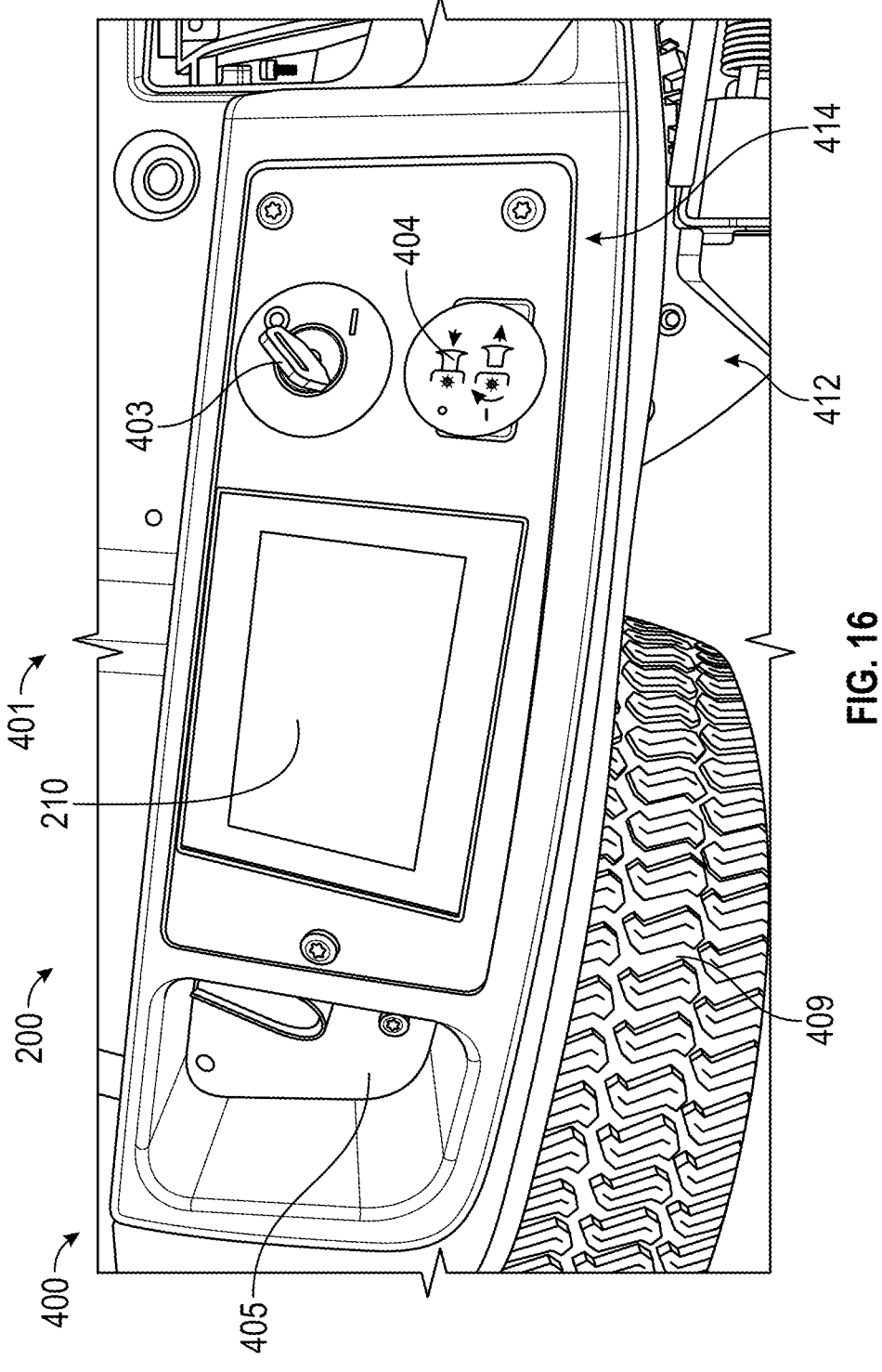
FIG. 16 is a top perspective view of a control panel of the mower of FIG. 13 including the runtime module of FIG. 1 or FIG. 2 with a touchscreen display.

FIG. 16 illustrates another exemplary embodiment of the control panel 401 installed to the side of the 414 on one of the armrests 416. In the illustrated embodiment, the control panel 401 includes the power button 403 is in the form of a key switch, and the display 210 is a graphical user interface that includes touchscreen functionality. For example, the display 210 includes the first chore motor control button 264 to control a speed of the traction motors 404 and the second chore motor control button 266 to control a speed of the implement motors 408 (and thereby a speed of the blades 410 (see, e.g., FIG. 4).

Figure 17:
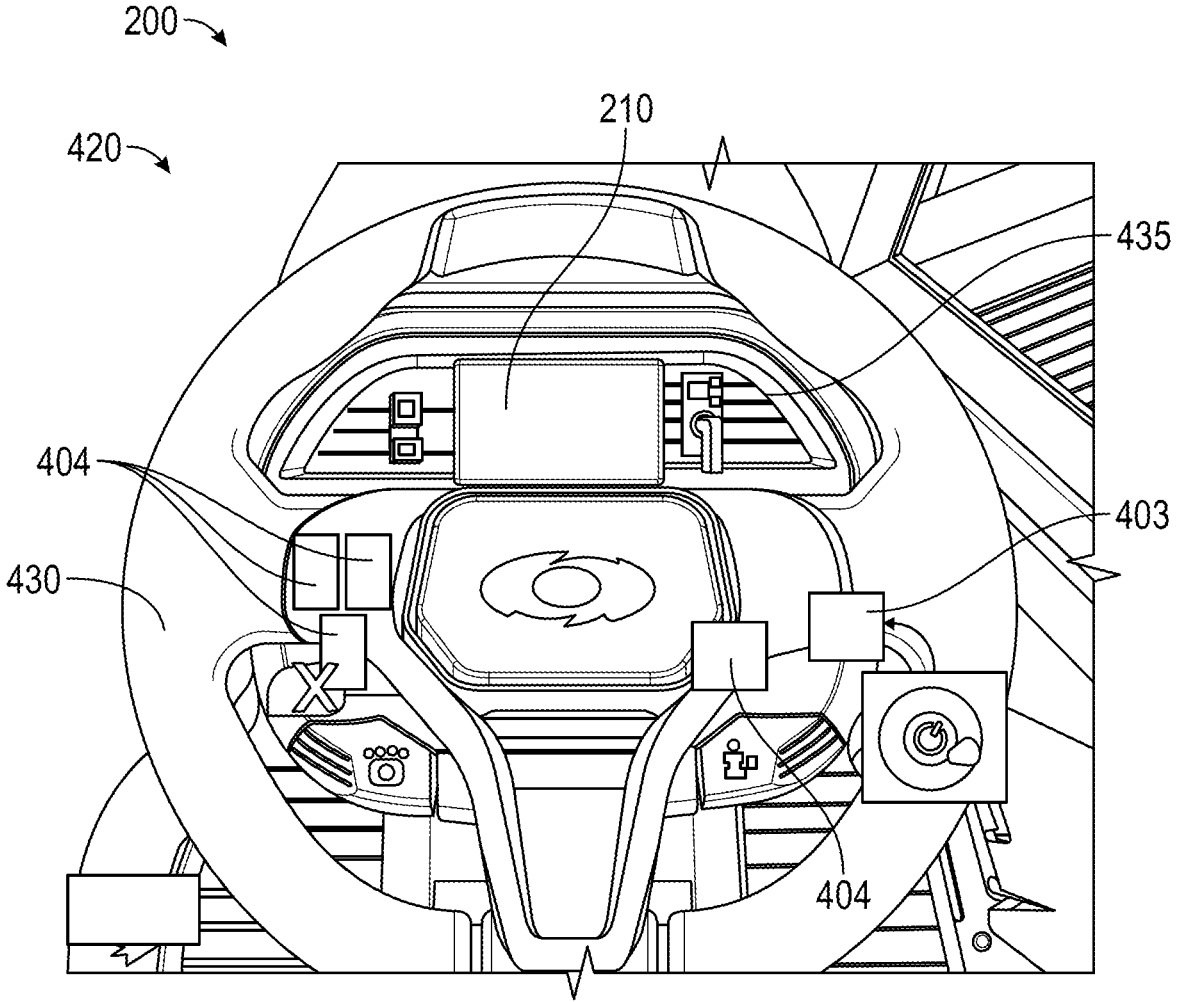
FIG. 17 is a perspective view of a riding mower having a steering wheel and a control panel with the runtime module of FIG. 1 or FIG. 2.
Figure 19:
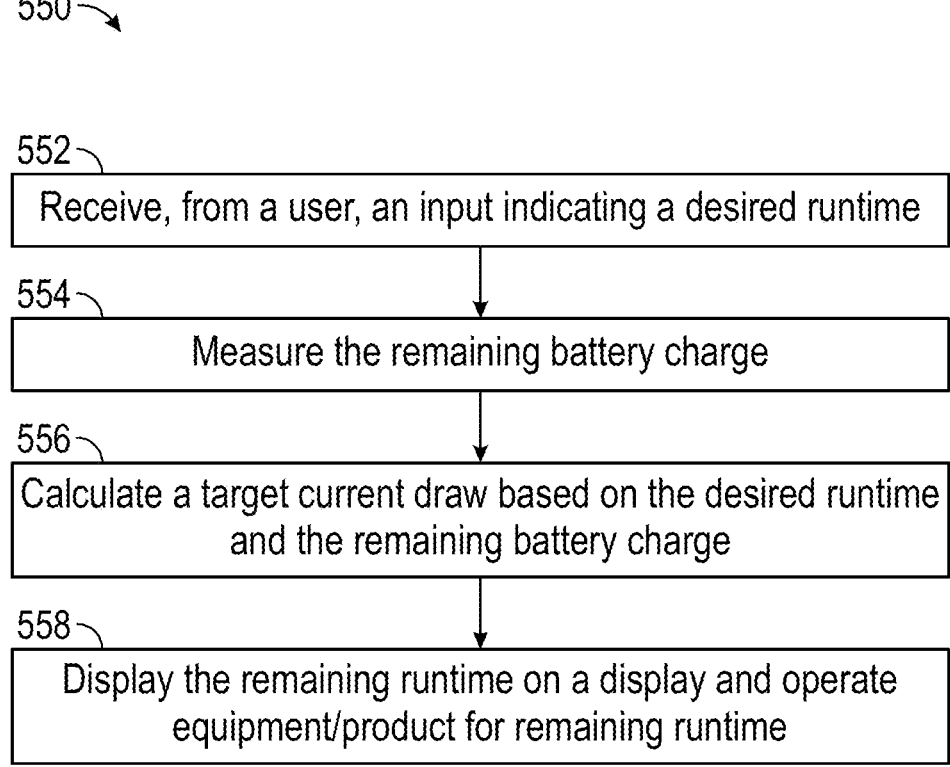
FIG. 19 is a flowchart outlining the steps in a method of controlling a power output level of a battery-powered outdoor power equipment or chore product.

FIG. 17 illustrates another exemplary embodiment of the runtime module 200 as installed in a riding mower 420. The runtime module 200 may be installed on a steering wheel 430 of the riding mower 420 or partially on the steering wheel 430 and partially on a dash panel 435, such that the user's hand can reach the runtime module 200 when seated on the mower 420. For example, the display 210 may be located on the dash panel 435, while the power button 230 and additional controls 407 (e.g., the power input 235) may be located on the steering wheel 430.

FIG. 18 illustrates a method 500 of communicating the remaining runtime of an outdoor power equipment or chore product to a user according to an exemplary embodiment. The product/equipment includes a battery that powers one or more motors, actuators, or pumps, or compressors. After the outdoor power equipment or chore product is moved into an active mode, the current drawn from the battery is continuously measured and recorded at step 502. The amount of charge remaining in the battery or battery pack is then measured at step 504. In some embodiments, the remaining charge in the battery (e.g., state of charge) is communicated to a vehicle controller or to a controller in a runtime module (e.g., the controller 248). In some embodiments, the remaining charge in the battery is provided by a battery management system. At step 506, the recorded current draw data and the amount of charge remaining in the battery or battery pack are used to determine the remaining runtime. The remaining runtime can be calculated based on the remaining battery charge and one or more of (a) the average current drawn over a predetermined period of time, (b) the average current drawn since equipment startup, (c) changes in current draw over the predetermined period of time, (d) changes in current draw over a second predetermined period of time, (e) changes in current draw since equipment startup; or (f) the linear relationships in the runtime calculation 259 described herein. At step 508, the remaining runtime is displayed to a user (e.g., via the display 210).

In the case of a pressure washer, the remaining runtime may refer to the remaining time that the pressure washer may be in a trigger-on condition before the battery charge becomes fully depleted. Additionally or alternatively the calculated remaining runtime may indicate the total amount of time remaining including both the time that the pressure washer is in a "trigger-on" condition and the time that the pressure washer is in a standby condition before the battery charge becomes fully depleted. For example, the electronic display may indicate both the remaining trigger-on time and the combined remaining time in the trigger-on condition and standby condition. The remaining runtime in either case may be based on the remaining battery charge and one or more of (a) average power usage over a predetermined period of time, (b) average power usage since pressure washer startup, (c) changes in power usage over the predetermined period of time, (d) changes in power usage over a second predetermined period of time, (e) changes in power usage since pressure washer startup, (f) the amount of trigger-on time over a third predetermined period of time, or (g) the amount of trigger-on time since pressure washer startup.

FIG. 4B illustrates a method 550 of controlling the power output level of a battery-powered outdoor power equipment or chore product according to an exemplary embodiment. At step 552, a user input indicating a desired runtime is received (e.g., at the display 210). At step 554, the amount of charge remaining in the battery or battery pack is measured. At step 556, the desired runtime and the amount of charge remaining in the battery or battery pack is used to determine a target current draw of the outdoor power equipment or chore product. The target current draw may be calculated such that the outdoor power equipment or chore product operates at an average of the target current draw for the desired runtime and the battery or battery pack may become fully depleted at the end of the desired runtime. At step 558, the outdoor power equipment unit is operated at an average of the target current draw for the desired runtime.

In the event a user enters a desired runtime that is so long as to require a current draw lower than an operable level of the outdoor power or chore product, the display (e.g., the display 210) may indicate that the battery charge is too low for the requested runtime. In the event a user enters a runtime that is so short that the outdoor power equipment or chore product may run at maximum current draw for longer than the desired runtime, the outdoor power equipment or chore product may operate at maximum current draw for the desired runtime and may continue to operate after the desired runtime has elapsed.

As utilized herein with respect to numerical ranges, the terms "approximately," "about," "substantially," and similar terms generally mean +/−10% of the disclosed values. When the terms "approximately," "about," "substantially," and similar terms are applied to a structural feature (e.g., to describe its shape, size, orientation, direction, etc.), these terms are meant to cover minor variations in structure that may result from, for example, the manufacturing or assembly process and are intended to have a broad meaning in harmony with the common and accepted usage by those of ordinary skill in the art to which the subject matter of this disclosure pertains. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

The hardware and data processing components used to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device) may include one or more devices (e.g., RAM, ROM, Flash memory, hard disk storage) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit or the processor) the one or more processes described herein.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, or other optical disk storage, magnetic disk storage or other magnetic storage devices, or any other medium which can be used to carry or store desired program code in the form of machine-execut- able instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It is important to note that the construction and arrangement of the runtime module or hand control 200 as shown in the various exemplary embodiments is illustrative only. Additionally, any element disclosed in one embodiment may be incorporated or utilized with any other embodiment disclosed herein. For example, the hand control 200 of the exemplary embodiment shown in at least FIG. 6 may be incorporated in the mower 400 of the exemplary embodiment shown in at least FIG. 13. Although only one example of an element from one embodiment that can be incorporated or utilized in another embodiment has been described above, it should be appreciated that other elements of the various embodiments may be incorporated or utilized with any of the other embodiments disclosed herein.

What is claimed is:

1. A battery-powered outdoor power equipment, comprising:

a battery;

a first electric motor configured to receive electrical power from the battery, wherein the first electric motor is configured to operate at a first low power level and a first high power level;

a second electric motor configured to receive electrical power from the battery, wherein the second electric motor is configured to operate at a second low power level and a second high power level;

a runtime module including a display and a first control button, wherein the first control button is configured to change the first electric motor between the first low power level and the first high power level; and a controller in communication with the battery, the first electric motor, and the display, the controller having a processor and at least one memory and being config- ured to:

calculate a remaining runtime based on an interpolation of a plurality of linear relationships between the remaining runtime and a battery charge level of the battery, the linear relationships comprising a first linear relationship for the first electric motor oper- ating at the first low power level and the second electric motor operating at the second low power level, a second linear relationship for the first electric motor operating at the first low power level and the second electric motor operating at the second high power level, a third linear relationship for the first electric motor operating at the first high power level and the second electric motor operating at the second low power level, and a fourth linear relationship for the first electric motor operating at the first high power level and the second electric motor operating at the second high power level;

communicate the calculated remaining runtime of the battery to the display; and update the remaining runtime in response to an input to the first control button.

2. The battery-powered outdoor power equipment of claim 1, wherein the first control button is a switch that is configured to pivot or rotate to change the first electric motor between the first low power level and the first high power level.

3. The battery-powered outdoor power equipment of claim 1, wherein the first control button is a graphical button on the display.

4. The battery-powered outdoor power equipment of claim 1, wherein the runtime module includes a power button that is configured to transition the battery-powered outdoor power equipment from an accessory mode to an active mode.

5. The battery-powered outdoor power equipment of claim 1, wherein the runtime module includes a second control button configured to change the second electric motor between the second low power level and the second high power level.

6. The battery-powered outdoor power equipment of claim 5, wherein the first control button and the second control button are both graphical buttons on the display.

7. The battery-powered outdoor power equipment of claim 5, wherein the controller is configured to update the remaining runtime in response to any input to the first control button or the second control button.

8. The battery-powered outdoor power equipment of claim 1, further comprising a seat, wherein the runtime module is arranged on a side of the seat.

9. A method of communicating to a user a remaining runtime for battery-powered outdoor power equipment, the battery-powered outdoor power equipment including a bat- tery, a runtime module including a display and a first control button, a controller, a first electric motor powered by the battery, and a second electric motor powered by the battery, the method comprising:

measuring, by the controller, a remaining battery charge of the battery;

calculating, by the controller, a remaining runtime of the battery based on the remaining battery charge, an interpolation of a plurality of linear relationships between the remaining runtime and a battery charge level of the battery, the linear relationships comprising a first linear relationship for the first electric motor operating at a first low power level and the second electric motor operating at a second low power level, a second linear relationship for the first electric motor operating at the first low power level and the second electric motor operating at a second high power level, a third linear relationship for the first electric motor operating at a first high power level and the second electric motor operating at the second low power level, and a fourth linear relationship for the first electric motor operating at the first high power level and the second electric motor operating at the second high power level, and one or more of:

(a) average current drawn from the battery over a predetermined period of time, (b) average current drawn from the battery since equipment startup, (c) changes in current drawn from the battery over the predetermined period of time, (d) changes in current drawn from the battery over a second predetermined period of time, or (e) changes in current drawn from the battery since equipment startup, and displaying, on the display of the runtime module in response to an input to the first control button, the calculated remaining runtime.

10. The method of claim 9, wherein the remaining runtime of the battery is calculated based on at least the remaining battery charge, the average current drawn over the predetermined period of time, and the changes in current drawn over the predetermined period of time.

11. The method of claim 9, wherein the remaining runtime of the battery is calculated based on at least the remaining battery charge, the average current drawn over the predetermined period of time, and the changes in current drawn over the second predetermined period of time.

12. The method of claim 9, wherein the remaining runtime of the battery is calculated based on at least the remaining battery charge, an average power usage since equipment startup, and changes in power usage since equipment startup.

13. The method of claim 9, further comprising:

updating the remaining runtime on the display in response to a power level of the first electric motor changing from the first low power level to the first high power level or from the first high power level to the first low power level.

* * * * *